(12) United States Patent
Kilian et al.

(10) Patent No.: US 11,881,637 B2
(45) Date of Patent: Jan. 23, 2024

(54) GENERATING A TUNING SIGNAL FOR TUNING A MAGNETIC ANTENNA

(71) Applicant: Fraunhofer-Gesellschaft zur Förderung der angewandten Forschung e.V., Munich (DE)

(72) Inventors: Gerd Kilian, Erlangen (DE); Josef Bernhard, Erlangen (DE); Tobias Dräger, Erlangen (DE); Christopher Laske, Erlangen (DE); Ralph Oppelt, Erlangen (DE); Michael Kamper, Erlangen (DE); Felix Auer, Erlangen (DE); Stefan Ereth, Erlangen (DE); Gerald Ulbricht, Erlangen (DE)

(73) Assignee: Fraunhofer-Gesellschaft zur Förderung der angewandten Forschung e. V., Munich (DE)

( * ) Notice: Subject to any disclaimer, the term of this patent is extended or adjusted under 35 U.S.C. 154(b) by 77 days.

(21) Appl. No.: 17/484,682

(22) Filed: Sep. 24, 2021

(65) Prior Publication Data
US 2022/0013910 A1 Jan. 13, 2022

Related U.S. Application Data

(63) Continuation of application No. PCT/EP2020/058381, filed on Mar. 25, 2020.

(30) Foreign Application Priority Data

Mar. 26, 2019 (DE) .......................... 102019204163.9

(51) Int. Cl.
*H01Q 7/00* (2006.01)
*G01R 33/36* (2006.01)
(Continued)

(52) U.S. Cl.
CPC ......... *H01Q 7/005* (2013.01); *G01R 33/3628* (2013.01); *G08C 17/04* (2013.01);
(Continued)

(58) Field of Classification Search
CPC ........ H01Q 7/005; H01Q 7/00; H01Q 9/0442; H04B 5/0012; H01F 2038/146; G01R 33/3628; G08C 17/04
See application file for complete search history.

(56) References Cited

U.S. PATENT DOCUMENTS 5,225,847 A * 7/1993 Roberts ................. H01Q 7/005
343/745
5,469,180 A * 11/1995 Wiggenhorn .......... H01Q 7/005
343/741
(Continued)

FOREIGN PATENT DOCUMENTS

DE 4327917 A1 3/1995
DE 69426013 T2 11/2000
(Continued)

OTHER PUBLICATIONS

ETSI TS 103 357 V1.1.1 (Jun. 2018), Short Range Devices; Low Throughput Networks (LTN); Protocols for radio interface A.
(Continued)

*Primary Examiner* — Vibol Tan
(74) *Attorney, Agent, or Firm* — Perkins Coie LLP; Michael A. Glenn

(57) ABSTRACT

Embodiments of the present invention provide an antenna arrangement including a magnetic antenna and a tuning element. The magnetic antenna includes a loop interrupted one or several times and a tuning element for tuning the magnetic antenna. The tuning element is configured to provide a tuning signal (e.g., control signal) for tuning the
(Continued)

magnetic antenna, and to control the tuning element with the tuning signal to tune the magnetic antenna.

16 Claims, 18 Drawing Sheets

(51) Int. Cl.
*G08C 17/04* (2006.01)
*H01Q 9/04* (2006.01)
*H04B 5/00* (2006.01)

(52) U.S. Cl.
CPC ............ *H01Q 7/00* (2013.01); *H01Q 9/0442* (2013.01); *H04B 5/0012* (2013.01)

(56) References Cited

U.S. PATENT DOCUMENTS

| | | | |
|---|---|---|---|
| 5,491,715 | A | 2/1996 | Flaxl |
| 7,890,070 | B2 | 2/2011 | Bollenbeck et al. |
| 8,552,911 | B2 * | 10/2013 | Ham ..................... H01Q 9/14 343/703 |
| 9,671,478 | B2 | 6/2017 | Driesel et al. |
| 2013/0016018 | A1 | 1/2013 | Ham |
| 2014/0176341 | A1 | 6/2014 | Bernhard et al. |
| 2015/0355251 | A1 | 12/2015 | Pascolini |
| 2016/0164495 | A1 | 6/2016 | Backes et al. |
| 2021/0359425 | A1 | 11/2021 | Ulbricht et al. |

FOREIGN PATENT DOCUMENTS

| | | | | |
|---|---|---|---|---|
| DE | 102011082098 | B4 | 3/2013 | |
| DE | 202018006239 | U1 * | 11/2019 | ............ H01Q 7/04 |
| DE | 102019201262 | A1 | 8/2020 | |
| EP | 0584882 | A1 | 3/1994 | |
| EP | 2034557 | A2 | 3/2009 | |
| WO | 9115878 | A1 | 10/1991 | |
| WO | WO-2009136794 | A1 * | 11/2009 | ............ H01Q 7/005 |
| WO | WO-2013013680 | A1 * | 1/2013 | ............ G01R 33/36 |

OTHER PUBLICATIONS https://de.wikipedia.org/wiki/Balun (with English version of the website).
https://de.wikipedia.org/wiki/Gilbertzelle (with English version of the website).
https://de.wikipedia.org/wiki/Schwingkreis (with English version of the website).
MOSFET; https://de.wikipedia.org/wiki/Metall-Halbleiter-Feldeffekttransistor (with English version of the website).
Bollenbeck, J., et al., "Ein neuartiges Tracking-Filter für hochwertige LO-Signale", UKW-Berichte Mar. 2013, p. 157-176.
Frenzel, Louis E., "Electronics explained: fundamentals for engineers, technicians, and makers", Second edition. Kidlington, Oxford, United Kingdom; Cambridge, MA : Newnes, 2018, S. 79-80.
Meinke, Gundlach, "Taschenbuch der Hochfrequenztechnik", Springer Verlag, 1962, S.879, Tab.4.4.
Parpart, J. V., "Breitbandige Ferrit-Hochfrequenztransformatoren", Hüthig GmbH, Heidelberg, 1997.
Wark, Klaus W., "Antennen und Strahlungsfelder", 5th edition, Springer Verlag, p. 233.

* cited by examiner

GENERATING A TUNING SIGNAL FOR TUNING A MAGNETIC ANTENNA

CROSS-REFERENCE TO RELATED APPLICATIONS

This application is a continuation of copending International Application No. PCT/EP2020/058381, filed Mar. 25, 2020, which is incorporated herein by reference in its entirety, and additionally claims priority from German Application No. 102019204163.9, filed Mar. 26, 2019, which is also incorporated herein by reference in its entirety.

Embodiments of the present invention relate to tuning a magnetic antenna and in particular to generating a tuning signal for tuning the magnetic antenna. Some embodiments relate to a participant of a communication system having a magnetic antenna and tuning means for generating the tuning signal for tuning the magnetic antenna. Some embodiments relate to a generation of a tuning voltage.

BACKGROUND OF THE INVENTION

Conventionally, electric antennas or electrically short antennas are used especially in the area of sensor nodes. If, for example, an electric antenna commonly used today is used at 868 MHz, a length of about 15 cm is needed as ½ lambda radiator. If shorter antennas are used, the gain of the antenna decreases. Further, the manageability of the devices with antennas is limited because the used antennas become detuned when approaching electrically conductive or dielectric objects, and thus their gain decreases further. Thus, there are requirements on the environment of e.g. sensor nodes. With electric antennas, it is still not possible to transmit out of electrically shielded environments (Faraday cage).

Further, magnetic antennas are known. However, due to their high Q, magnetic antennas are very narrow-band. Therefore, magnetic antennas have to be tuned to the desired frequency, e.g. when approaching metallic or dielectric objects.

If a magnetic antenna is operated in the immediate vicinity of materials, the same can have a positive or negative influence on the characteristics of the antenna, depending on the material characteristic (e.g. conductive, dielectric, insulating). Generally, magnetic antennas are detuned by the surrounding materials. That is, resonance tuning is no longer optimal at the operating frequency or matching to the feed resistor is no longer optimal. Generally, both are affected, but can be corrected by retuning the antenna (e.g. by changing the resonance capacitor or changing the coupling). However, this involves user intervention and a measured quantity by which an optimum setting can be determined.

SUMMARY

According to an embodiment, an antenna arrangement may have: a magnetic antenna including a loop interrupted one or several times and at least one tuning element for tuning the magnetic antenna, and tuning means connected to the tuning element, wherein the tuning means is configured to provide a control signal for tuning the magnetic antenna in dependence on a phase position of a signal advancing into the magnetic antenna, and to control the tuning element with the control signal to tune the magnetic antenna, wherein the tuning means is configured to provide the control signal for tuning the magnetic antenna in dependence on a phase relationship between the signal advancing into the magnetic antenna and a phase signal, wherein the tuning means is configured to derive a signal from the signal advancing into the magnetic antenna to obtain a derived signal, wherein the tuning means is configured to provide the control signal for tuning the magnetic antenna in dependence on a phase relationship between the derived signal and the phase signal, wherein the tuning means includes a signal combiner configured to combine the phase signal or a phase-shifted version of the phase signal, and the derived signal or a phase-shifted version of the derived signal, to obtain a combined signal, wherein the tuning means is configured to control the tuning element with the control signal to regulate a DC component of the combined signal or a low-pass filtered version of the combined signal to a predetermined set value.

According to another embodiment, an antenna arrangement may have: a magnetic antenna including a loop interrupted one or several times and at least one tuning element for tuning the magnetic antenna, and tuning means connected to the tuning element, wherein the tuning means is configured to provide a control signal for tuning the magnetic antenna in dependence on an amplitude of a signal based on a magnetic field generated by the loop, and to control the tuning element with the control signal to tune the magnetic antenna, wherein the tuning means is configured to select a control signal parameter from a set of stored control signal parameters associated with corresponding amplitude values in dependence on the amplitude of the signal based on the magnetic field generated by the loop, and to provide the control signal in dependence on the control signal parameter, or wherein the tuning means is configured, when a transmitting signal is transmitted at at least two different frequencies, to determine a tuning direction in which the control signal is to be readjusted based on at least two amplitudes of the signal resulting from the at least two different frequencies of the transmitting signal based on the magnetic field generated by the loop, and to readjust the control signal in dependence on the determined tuning direction.

According to an embodiment, an antenna arrangement may have: an antenna including at least one tuning element for tuning the antenna, and tuning means connected to the tuning element, wherein the tuning means is configured to provide a control signal for tuning the antenna in dependence on a power or current consumption of a transmitting means connected to the antenna or at least one active device of the transmitting means, and to control the tuning element with the control signal to tune the antenna, wherein the tuning means is configured to control the tuning element with the control signal to regulate the power or current consumption of the transmitting means or of the at least one active device of the transmitting means to a predetermined set value range, the predetermined set value range being determined when the transmitting means is terminated with a predefined impedance, or wherein the tuning means is configured to provide the control signal for tuning the antenna in dependence on a current consumption of at least one power transistor of an amplifier of the transmitting means, or wherein the tuning means is configured to provide the control signal for tuning the antenna in dependence on a bias current of at least one power transistor of the amplifier of the transmitting means.

Another embodiment may have a participant of a wireless communication system, wherein the participant includes transmitting and/or receiving means and an inventive antenna arrangement connected to the transmitting and/or receiving means.

According to another embodiment, a method for tuning a magnetic antenna with a loop interrupted one or several times may have the steps of: providing a control signal for tuning the magnetic antenna in dependence on a phase position of a signal advancing into the magnetic antenna, and controlling a tuning element of the magnetic antenna with the control signal to tune the magnetic antenna, wherein the control signal for tuning the magnetic antenna is provided in dependence on a phase relationship between the signal advancing into the magnetic antenna and a phase signal, deriving a signal from the signal advancing into the magnetic antenna to obtain a derived signal, wherein the control signal for tuning the magnetic antenna is provided in dependence on a phase relationship between the derived signal and the phase signal, wherein the phase signal or a phase-shifted version of the phase signal, and the derived signal or a phase-shifted version of the derived signal are combined to obtain a combined signal, controlling the tuning element with the control signal to control a DC component of the combined signal or a low-pass filtered version of the combined signal to a predetermined set value.

According to another embodiment, a method for tuning a magnetic antenna including a loop interrupted one or several times may have the steps of: providing a control signal for tuning the magnetic antenna in dependence on an amplitude of a signal based on a magnetic field generated by the loop; and controlling a tuning element of the magnetic antenna with the control signal to tune the magnetic antenna, selecting, in dependence on the amplitude of the signal based on the magnetic field generated by the loop, a control signal parameter from a set of stored control signal parameters associated with corresponding amplitude values, the control signal being provided in dependence on the control signal parameter, or determining, when a transmitting signal is transmitted at at least two different frequencies, a tuning direction in which the control signal is to be readjusted based on at least two amplitudes of the signal resulting from the at least two different frequencies of the transmitting signal based on the magnetic field generated by the loop, and readjusting the control signal in dependence on the determined tuning direction.

According to another embodiment, a method for tuning an antenna may have the steps of: providing a control signal for tuning the antenna in dependence on a power or current consumption of a transmitting means connected to the antenna or at least an active device of the transmitting means, and controlling a tuning element of the antenna with the control signal to tune the antenna, controlling the tuning element with the control signal to regulate the power or current consumption of the transmitting means or of the at least one active device of the transmitting means to a predetermined set value range, the predetermined set value range being determined when the transmitting means is terminated with a predefined impedance, or providing the control signal for tuning the antenna in dependence on a current consumption of at least one power transistor of an amplifier of the transmitting means, or providing the control signal for tuning the antenna in dependence on a bias current of at least one power transistor of the amplifier of the transmitting means.

Embodiments provide a magnetically self-tuning antenna.

Embodiments provide an antenna arrangement comprising a magnetic antenna and tuning means. The magnetic antenna includes a loop interrupted one or several times and at least one tuning element [e.g. a variable capacitor or a capacitance diode] for tuning the magnetic antenna. The tuning means is connected to the tuning element, wherein the tuning means is configured to provide a control signal [e.g. tuning voltage] for tuning the magnetic antenna in dependence on a phase position of a signal advancing into the magnetic antenna, and to control the tuning element with the control signal to tune the magnetic antenna.

In embodiments, a loop circumference of the loop interrupted one or several times can be ½ to ¹⁄₁₀ of a wavelength of the signal advancing into the magnetic antenna or of a transmitting signal to be transmitted by the magnetic antenna or a receiving signal received by the magnetic antenna. For example, the wavelength can be less than or equal to 1.999 m (e.g., at frequencies greater than or equal to 149 MHz), or less than or equal to 0.749 m (e.g., at frequencies greater than or equal to 400 MHz), or less than or equal to 0.375 m (e.g., at frequencies greater than or equal to 800 MHz).

In embodiments, a frequency of the signal advancing into the magnetic antenna or a transmitting signal to be transmitted with the magnetic antenna or a receiving signal to be received with the magnetic antenna can be greater than or equal to 149 MHz, 400 MHz, or 800 MHz, or can be in the range of 149 MHz to 930 MHz.

In embodiments, a frequency of the signal advancing into the magnetic antenna or a transmitting signal to be transmitted with the magnetic antenna or a receiving signal to be received with the magnetic antenna can be within an ISM band (ISM=Industrial, Scientific and Medical) or SRD band (SRD=Short Range Device) band, such as in the range of 169.4000-169.8125 MHz, or in the range of 433.05 MHz to 434.79 MHz, or in the range of 863-870 MHz, or in the range of 902 to 928 MHz.

In embodiments, the magnetic antenna can be narrowband. For example, in embodiments, the magnetic antenna can have a Q of 20 to 500. (Note: In magnetic antennas, the bandwidth is defined by the Q).

In embodiments, the tuning means can be configured to provide the control signal for tuning the magnetic antenna in dependence on a phase relationship between the signal advancing into the magnetic antenna and a phase signal.

In embodiments, the phase signal can be based on a current flowing in at least a portion of the loop.

In embodiments, the phase signal can be based on a magnetic field [e.g., in the near field] generated by the loop [or magnetic antenna].

In embodiments, the phase signal can be a power coupled out of the magnetic antenna [e.g., inductively].

In embodiments, the phase signal can be a signal coupled out of a magnetic field of the magnetic antenna.

In embodiments, the antenna arrangement or the tuning means can comprise a coupling loop configured to provide the phase signal.

In embodiments, the tuning means can comprise a coupling loop configured to couple power out of the magnetic antenna to obtain the power coupled out of the magnetic antenna [e.g., inductively].

For example, the loop of the magnetic antenna and the coupling loop can be arranged or implemented on the same printed circuit board.

In embodiments, the tuning means can be configured to control the tuning element with the control signal to regulate a phase difference between the signal advancing into the magnetic antenna and the phase signal to a predetermined set value.

For example, the tuning means can be configured to regulate the phase difference between the signal advancing into the magnetic antenna and the phase signal to the predetermined set value by controlling the tuning element with the control signal.

For example, the tuning means can be configured to track the control signal to counteract a deviation of the phase difference between the signal advancing into the magnetic antenna and the phase signal from the predetermined set value.

In embodiments, the tuning means can be configured to regulate control of the phase difference between the signal advancing into the magnetic antenna and the phase signal to the predetermined set value using a control loop or feed forward regulation.

In embodiments, the tuning means can be configured to derive a signal from the signal advancing into the magnetic antenna to obtain a derived signal, the tuning means being configured to provide the control signal for tuning the magnetic antenna in dependence on a phase relationship between the derived signal and the phase signal.

For example, the tuning means can be configured to control the tuning element with the control signal to regulate the phase difference between the derived signal and the phase signal to a predetermined set value.

In embodiments, the tuning means can comprise a signal combiner [e.g., multiplier] configured to combine
  the phase signal or a phase-shifted version of the phase signal, and
  the derived signal or a phase-shifted version of the derived signal,
to obtain a combined signal, the tuning means being configured to control the tuning element with the control signal to regulate a DC component of the combined signal or a low-pass filtered version of the combined signal to a predetermined set value.

In embodiments, the tuning means can comprise a phase shifter configured to phase-shift one of the derived signal and the phase signal to obtain a phase shifted signal, the signal combiner [e.g. multiplier] being configured to combine the phase-shifted signal and the other of the derived signal and the phase signal to obtain the combined signal, wherein the phase shifter is configured to phase-shift the one of the derived signal or the phase signal such that, in the resonance case of the magnetic antenna, the phase-shifted signal and the other of the derived signal and the phase signal have a predefined phase difference [e.g. 90°] at the signal combiner.

In embodiments, the tuning means can comprise an energy decoupler [e.g., a directional coupler or other apparatus for coupling out energy] configured to couple out a portion of the signal advancing into the magnetic antenna to obtain the derived signal.

In embodiments, the tuning means can comprise a regulating amplifier configured to provide the control signal for tuning the magnetic antenna, the regulating amplifier being configured to control the tuning element with the control signal to regulate a DC component of the combined signal or a low-pass filtered version of the combined signal to a predetermined set value.

In embodiments, the directional coupler can comprise a first terminal, a second terminal, a third terminal, and a fourth terminal, the directional coupler comprising a first resistor [e.g., of size Z0/N] connected between the first terminal and the second terminal, the directional coupler comprising a second resistor [e.g., of size 2N*Z0] connected between the first terminal and the third terminal, the directional coupler comprising a third resistor [e.g., of size 2N*Z0] connected between the second terminal and the fourth terminal, the directional coupler comprising a transformer, a first coil of the transformer being connected between the first terminal and the third terminal, and a second coil of the transformer being connected between the second terminal and the fourth terminal [e.g. the first coil and the second coil having the same number of windings].

In embodiments, the directional coupler can comprise a first terminal, a second terminal, a third terminal, and a fourth terminal, the directional coupler comprising a first resistor [e.g., of size Z0/N] connected between the first terminal and the second terminal, the directional coupler comprising a second resistor [e.g., of size 2N*Z0] connected between the first terminal and the third terminal, the directional coupler comprising a third resistor [e.g., of size 2N*Z0] connected between the second terminal and the fourth terminal, the directional coupler comprising a transformer, a first coil of the transformer being connected between the first terminal and the second terminal, and a second coil of the transformer being connected between the third terminal and the fourth terminal [e.g. the first coil and the second coil having the same number of windings].

Further embodiments include an antenna arrangement having a magnetic antenna and a tuning means. The magnetic antenna includes a loop interrupted one or several times and at least one tuning element [e.g. a variable capacitor or a capacitance diode] for tuning the magnetic antenna. The tuning means is connected to the tuning element, wherein the tuning means is configured to provide a control signal [e.g., tuning voltage] for tuning the magnetic antenna in dependence on an amplitude of a signal based on a magnetic field [e.g., in the near field] generated by the loop [or magnetic antenna], and to control the tuning element with the control signal to tune the magnetic antenna.

In embodiments, the tuning means can comprise an induction loop or induction coil configured to provide the signal based on the magnetic field generated by the loop.

In embodiments, the loop of the magnetic antenna and the induction loop or induction coil can be arranged [e.g., implemented] on the same circuit board.

In embodiments, the tuning means can be configured to control the tuning element with the control signal to regulate the amplitude of the signal based on the magnetic field generated by the loop to a predetermined set value [e.g., so that the amplitude is greater than or equal to a predetermined set value].

For example, the tuning means can be configured to regulate the amplitude of the signal based on the magnetic field generated by the loop to the predetermined set value by controlling the tuning element with the control signal.

For example, the tuning means can be configured to track the control signal to counteract a deviation of the amplitude of the signal based on the magnetic field generated by the loop from the predetermined set value.

In embodiments, the predetermined set value can have been determined in advance [e.g., in a factory calibration] by a reference measurement in the undisturbed case of the magnetic antenna and/or in the resonance case of the magnetic antenna.

In embodiments, the tuning means can be configured to determine the predetermined set value by a reference measurement in the undisturbed case of the magnetic antenna and/or in the resonance case of the magnetic antenna.

In embodiments, a predetermined signal can be emitted with the magnetic antenna during the reference measurement.

For example, the predetermined signal can have a predetermined waveform, predetermined transmitting frequency, predetermined bandwidth, predetermined amplitude, and/or predetermined modulation type.

For example, the predetermined signal can be a sinusoidal signal with a normalized transmitting voltage.

In embodiments, the tuning means can be configured to select, in dependence on the amplitude of the signal based on the magnetic field generated by the loop, a control signal parameter from a set of stored control signal parameters associated with corresponding amplitude values, and to provide the control signal in dependence on the control signal parameter [e.g., control signal amplitude].

In embodiments, the tuning means can be configured to determine, in the case of a broadband transmission of a transmitting signal or a transmission of the transmitting signal at multiple frequencies, a frequency-dependent amplitude distribution of the signal based on the magnetic field generated by the loop, and to provide the control signal in dependence on the frequency-dependent amplitude distribution.

In embodiments, the tuning means can be configured to determine, when a transmitting signal is emitted at at least two different frequencies, a tuning direction in which the tuning signal is to be readjusted based on at least two amplitudes of the signal resulting from the at least two different frequencies of the transmitting signal based on the magnetic field generated by the loop, and to readjust the tuning signal in dependence on the determined tuning direction.

Further embodiments provide an antenna arrangement comprising an antenna and a tuning means. The antenna comprises at least one tuning element [e.g. a variable capacitor or a capacitance diode] for tuning the antenna. The tuning means is connected to the tuning element, the tuning means being configured to provide a control signal for tuning the antenna in dependence on a power or current consumption of a transmitting means connected to the antenna or at least one active device [e.g. power transistor] of the transmitting means, and to control the tuning element with the control signal to tune the antenna.

In embodiments, the antenna can be an electric antenna.

In embodiments, the antenna can be a magnetic antenna having a loop interrupted one or several times.

In embodiments, the tuning means can be configured to control the tuning element with the control signal to regulate the power or current consumption of the transmitting means or the at least one active device of the transmitting means to a predetermined set value range.

For example, the tuning means can be configured to regulate the power or current consumption of the transmitting means or of the at least one active device of the transmitting means to the predetermined set value range by controlling the tuning element with the control signal.

For example, the tuning means can be configured to track the control signal to counteract a deviation of the power or current consumption of the transmitting means or the at least one active device of the transmitting means from the predetermined value range.

In embodiments, the predetermined set value range can be determined [e.g., in advance/at the factory] by a system simulation assuming ideal or near-ideal matching of the antenna.

In embodiments, the predetermined set value range can be determined [e.g., in advance/at the factory] when the transmitting means is terminated with a predefined impedance [e.g., 50 ohms].

For example, the transmitting means can be terminated with a predefined impedance [e.g. 50 ohms] and the power or current consumption of the transmitting means can be determined [e.g. measured] to obtain the predetermined set value range. The predetermined set value range can, for example, correspond to the determined power or current consumption with a tolerance of ±10% (or ±5% or ±3%).

In embodiments, the predetermined set value range can be determined based on an antenna measurement [e.g., by means of an antenna tuner].

For example, the antenna measurement can determine the point of maximum radiation power and determine the power or current consumption of the transmitting means at that point to obtain the predetermined set value range. For example, the predetermined set value range can correspond to the determined power or current consumption with a tolerance of ±10% (or ±5% or ±3%).

In embodiments, the predetermined set value range can be determined [e.g., in advance/at the factory] based on an average value of the power or current consumption with the short-circuited terminal and open terminal of the transmitting means.

For example, the power or current consumption of the transmitting means with short-circuited terminal and open terminal can be determined and the average value of the power or current consumption of the transmitting means with short-circuited terminal and open terminal can be determined to obtain the predetermined set value range. For example, the predetermined set value range can correspond to the average value of the power or current consumption with a tolerance of ±10% (or ±5% or ±3%).

In embodiments, the predetermined set value range can be determined [e.g., in advance/at the factory] based on a measurement of a radiation power.

For example, when measuring the radiation power, the maximum radiation power can be determined and the power or current consumption at the maximum radiation power can be determined [e.g., measured] to obtain the predetermined set value range. The predetermined set value range can correspond, for example, to the determined power or current consumption with a tolerance of ±10% (or ±5% or ±3%).

In embodiments, the radiation power can be measured using an external antenna or by the tuning means itself using an antenna of the tuning means.

For example, the antenna of the tuning means can be a coupling loop arranged [e.g., implemented] on the same circuit board as the loop of the magnetic antenna.

In embodiments, the tuning means can be configured to provide the control signal for tuning the antenna in dependence on a current consumption of at least one power transistor of an amplifier of the transmitting means.

In embodiments, the tuning means can be configured to provide the control signal for tuning the antenna in dependence on a difference in supply currents from two power transistors of the amplifier of the transmitting means.

In embodiments, the tuning means can be configured to provide the control signal for tuning the antenna in dependence on a bias current of at least one power transistor of the amplifier of the transmitting means.

In embodiments, the tuning means can be configured to determine the bias current of the at least one power transistor by measuring a voltage across a resistor in the bias branch of the power transistor.

In embodiments, the tuning means can be configured to provide the control signal for tuning the antenna in dependence on a difference between bias currents of at least two power transistors of the amplifier of the transmitting means.

In embodiments, the tuning means can be configured to provide the control signal for tuning the antenna in dependence on a difference in supply currents of a balanced amplifier of the transmitting means.

In embodiments, the tuning means can be configured to provide the control signal for tuning the antenna in dependence on a difference in supply currents of a Doherty amplifier of the transmitting means.

In embodiments, the tuning means can be configured to provide the control signal for tuning the antenna in dependence on a difference in supply currents of a push-pull amplifier of the transmitting means.

In embodiments, the tuning means can be configured to provide the control signal for tuning the antenna in dependence on a common mode impedance of the antenna.

In embodiments, the tuning means can be configured to determine the common mode impedance of the antenna by means of a measurement signal.

In embodiments, the tuning means can be configured to determine the current consumption of the transmitting means when alternately feeding a push-pull signal and common mode signal to the antenna.

In embodiments, the common mode signal can be fed in by means of a balun that provides access to the common mode.

In embodiments, the tuning means can be configured to provide the control signal for tuning the antenna in dependence on a reflected common mode signal of the antenna.

In embodiments, the tuning means can be configured to determine [e.g., measure] the reflected common mode signal using a balun that provides access to the common mode.

In embodiments, the tuning means can be configured to determine [e.g., measure] the reflected common mode signal via nonlinear characteristics of a magnetic core of the balun.

In embodiments, the tuning means can be configured to determine [e.g., measure] a DC magnetic current of the magnetic core by means of a Hall sensor.

In embodiments, the tuning means can be configured to determine [e.g., measure] a DC magnetic current of the magnetic core by means of a measurement winding at the magnetic core.

In embodiments, the balun can be a ring coupler.

In embodiments, the loop can be interrupted once, wherein the loop is interrupted by the tuning element.

In embodiments, the loop can be interrupted several times, wherein the loop is interrupted by the tuning element and by one or several capacitance elements.

In embodiments, the tuning element can be a variable capacitor or a capacitance diode.

Further embodiments provide a participant of a wireless communication system, the participant comprising a transmitting and/or receiving means and an antenna arrangement connected to the transmitting and/or receiving means according to any of the embodiments described herein.

Further embodiments provide a method for tuning a magnetic antenna having a loop interrupted one or several times. The method comprises a step of providing a control signal for tuning the magnetic antenna in dependence on a phase position of a signal advancing into the magnetic antenna. The method further comprises a step of controlling a tuning element of the magnetic antenna with the control signal to tune the magnetic antenna.

Further embodiments provide a method for tuning a magnetic antenna having a loop interrupted one or several times. The method comprises a step of providing a control signal for tuning the magnetic antenna in dependence on an amplitude of a signal based on a magnetic field generated by the loop. The method further comprises a step of controlling a tuning element of the magnetic antenna with the control signal to tune the magnetic antenna.

Further embodiments provide a method for tuning an antenna. The method includes a step of providing a control signal for tuning the antenna in dependence on a power or current consumption of a transmitting means connected to the antenna or at least an active device of the transmitting means. The method further comprises a step of controlling a tuning element of the antenna with the control signal to tune the antenna.

Magnetic antennas addressed in the embodiments can (1) reduce the size of participants in a communication system, such as sensor nodes, (2) provide environmental independence through automatic tuning, and/or (3) transmit/receive (better from partially) electrically shielded environments.

BRIEF DESCRIPTION OF THE DRAWINGS

Embodiments of the present invention will be detailed subsequently referring to the appended drawings, in which.

DETAILED DESCRIPTION OF THE INVENTION

In the following description of the embodiments of the present invention, the same or equal elements are provided with the same reference numbers in the figures, so that the description of the same is interchangeable.

Before describing embodiments of generating a tuning signal for tuning a magnetic antenna in section 2, embodiments of the magnetic antenna are first described in section 1.

In the following description, it is assumed by way of example that the magnetic antenna can be implemented in a participant of a communication system.

1. Configuration of a Magnetic Antenna

Figure 1A:
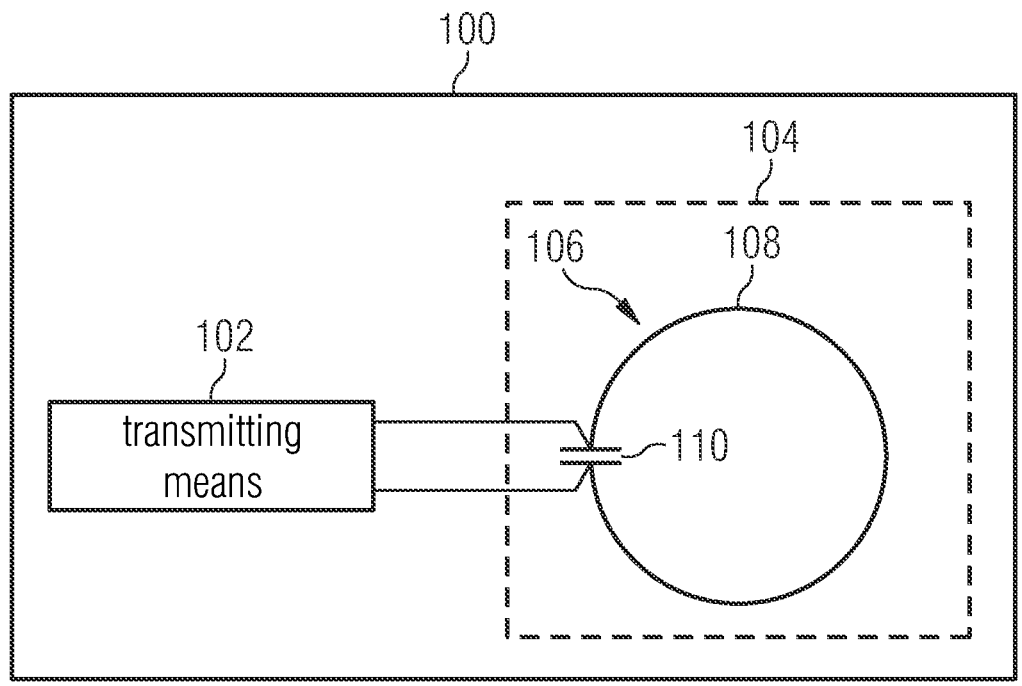
FIG. 1a is a schematic view of a participant of a communication system, according to an embodiment of the present invention.

FIG. 1a shows a schematic view of a participant 100 of a communication system, according to an embodiment of the present invention. The participant 100 includes a transmitting and/or receiving means 102 (e.g. a transmitter) and an antenna arrangement 104 connected to the transmitting and/or receiving means 102, wherein the antenna arrangement 104 comprises a magnetic antenna 106 having a loop 108 interrupted one time (i.e. only once).

Figure 1B:
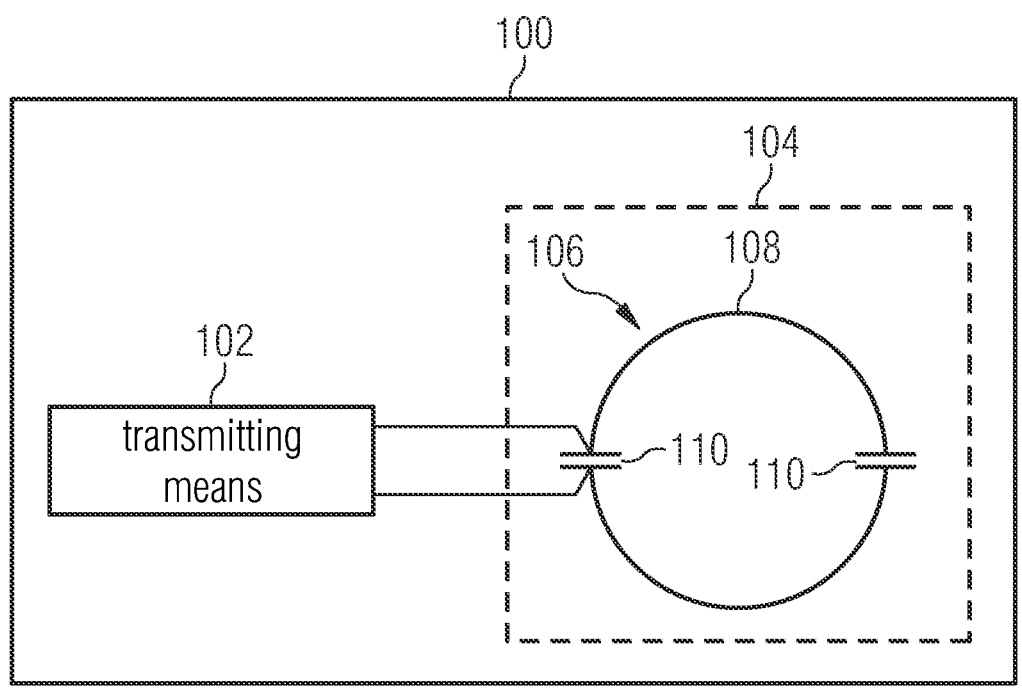
FIG. 1b is a schematic view of a participant of a communication system, according to an embodiment of the present invention.

FIG. 1b shows a schematic view of a participant 100 of a communication system, according to an embodiment of the present invention. The participant 100 includes transmitting and/or receiving means 102 (e.g. a transmitter) and an antenna arrangement 104 connected to the transmitting and/or receiving means 102, wherein the antenna arrangement 104 comprises a magnetic antenna 106 having a loop 108 interrupted several times.

In the following, primarily, embodiments of the antenna arrangement 104 shown in FIG. 1b having the magnetic antenna 106 with the loop interrupted several times will be described. However, it should be noted that the embodiments described below are equally applicable to the antenna arrangement 104 having the magnetic antenna 106 with the loop interrupted once shown in FIG. 1a.

In embodiments, the loop 108 of the magnetic antenna 106 can be interrupted by capacitance elements 110, such as resonance capacitances (resonance capacitors). For example, as shown in FIG. 1b for illustrative purposes, the loop 108 of the magnetic antenna 106 can be interrupted two times (e.g., capacitively shortened) by two capacitance elements 110. However, it should be noted that in embodiments, the loop 108 of the magnetic antenna 106 can also be interrupted several times by a different number of capacitance elements 110. Thus, in embodiments, the loop 108 of the magnetic antenna 106 can be divided into n segments (or parts, or sections) by n capacitance elements 110, wherein n is a natural number greater than or equal to two. As used herein, segments are the parts or sections of the loop between the respective capacitance elements 110.

In embodiments, the segments of the loop 108 interrupted several times can be connected by the capacitance elements 110. Specifically, each two segments of the loop interrupted several times can be connected by one capacitance element each that is connected in series between the two segments. In other words, the segments of the loop 108 of the magnetic antenna 106 and the capacitance elements 110 are alternately connected in series to form a loop.

Here, the transmitting and/or receiving means 102 can be connected to the magnetic antenna 106 via one of the capacitance elements 110. The one capacitance element on the one side and the loop 108 interrupted several times with the other (or remaining) capacitance elements on the other side can form (e.g. from the point of view of the transmitting and/or receiving means 102) a parallel resonant circuit.

In embodiments, the antenna arrangement 102 can further comprise tuning means for tuning the magnetic antenna 106. The tuning means can be configured to tune the magnetic antenna 106 automatically.

Due to the geometric shape of the loop 108 of the magnetic antenna 106, the radiation energy from the magnetic antenna 106 is not radiated evenly in all directions of a plane. Rather, the antenna pattern of the magnetic antenna 106 shown in FIG. 1b comprises zero points, i.e., there are areas (e.g., points) in the antenna pattern where the radiation energy from the magnetic antenna is virtually zero. In embodiments, the antenna arrangement 104 can therefore include a second magnetic antenna, as will be discussed in more detail below with reference to FIG. 5, or an additional electric antenna. The second magnetic antenna and/or the additional electric antenna can be arranged such as to compensate for the zero points of the magnetic antenna 106.

In embodiments, of course, the participant 100 of the communication system can be configured not only to transmit signals to other participants of the communication system by means of the magnetic antenna 106, but also to receive signals from other participants of the communication system by means of the magnetic antenna 106. For this purpose, the participant 100 can, for example, comprise receiving means (e.g., a receiver) connected to the antenna arrangement 104. Obviously, the participant 100 can also comprise a combined transceiving means (e.g., a transceiver) 102.

In embodiments, the participant 100 (or the participant's communication system) can be configured to communicate in the ISM band (ISM=Industrial, Scientific and Medical), i.e., to transmit and/or receive signals in the ISM band.

In embodiments, the participant 100 (or the participant's communication system) can be configured to transmit data based on the telegram splitting method. In the telegram splitting method, data, such as a telegram or data packet, are divided into a plurality of sub-data packets (or partial data packets, or sub-packets) and the sub-data packets are distributed in time and/or frequency from one participant to another participant (e.g., from the base station to the end point, or from the end point to the base station) of the communication system using a time and/or frequency hopping pattern (i.e. non-contiguously), wherein the participant receiving the sub-data packets reassembles (or combines) the same to obtain the data packet. Here, each of the sub-data packets contains only a part of the data packet. The data packet can further be channel-coded so that not all of the sub-data packets but only a part of the sub-data packets is needed for error-free decoding of the data packet.

In embodiments, the communication system can be a personal area network (PAN) or a low power wide area network (LPWAN).

The participant 100 of the communication system shown in FIG. 1b can be a base station of the communication system. Alternatively, the participant 100 of the communication system shown in FIG. 1b can be an end point of the communication system, as explained below with reference to FIG. 1c.

Figure 1C:
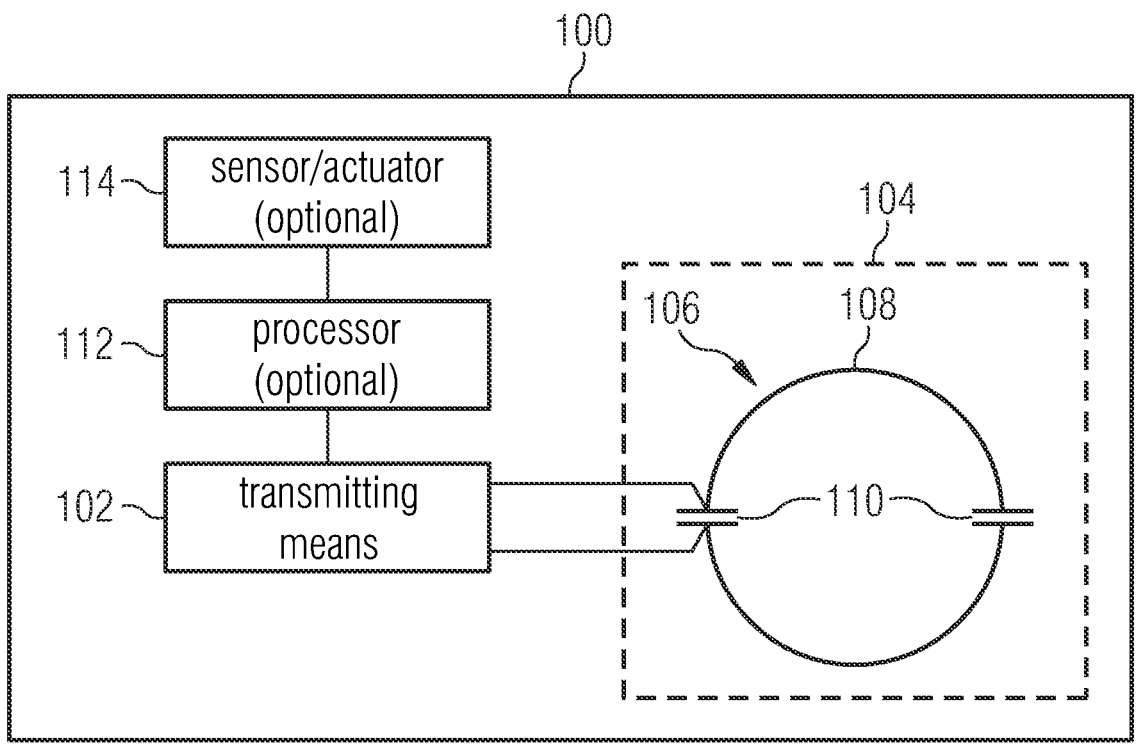
FIG. 1c is a schematic view of an end point of a communication system, according to an embodiment of the present invention.

In detail, FIG. 1c shows a schematic view of a participant 100 of the communication system, wherein the participant 100 is an end point, according to an embodiment of the present invention.

As shown exemplarily in FIG. 1c, in embodiments, the end point 100 can be a sensor node. For example, in the case of a sensor node, the end point 100 can comprise a sensor 114, such as a temperature sensor, pressure sensor, humidity sensor, or any other sensor, wherein the signals transmitted by the sensor node 100 are dependent on a sensor signal provided by the sensor. For example, the sensor can comprise a microprocessor 112 that processes the sensor signal provided by the sensor to generate data to be transmitted based on the sensor signal by the transmitting means (e.g., transmitting and receiving means) 102, for example, based on the telegram splitting transmission method.

Obviously, the end point 100 can also be an actuator node, wherein the actuator node includes an actuator 114. In this case, the processor 112 can be configured, for example, to control the actuator 114 based on a received signal or received data.

In embodiments, the end point 100 can be battery-operated. Alternatively or additionally, the end point 100 can comprise an energy-harvesting element for electrical energy generation.

Detailed embodiments of the magnetic antenna 106 and/or the antenna arrangement 104 (e.g., for sensor nodes or base stations) are described below. Here, the magnetic antenna 106 and/or the antenna arrangement 104 can be used for the transmitting and/or receiving case.

1.1. Application of Magnetic Antennas for Sensor Nodes

A magnetic antenna 106 comprises a single- or multi-turn current loop 108. In the receiving case, an alternating magnetic field induces a voltage in the loop 108 (law of induction), and in the transmitting case, a current flowing in the loop 108 generates a magnetic field (Biot-Savart law). If the magnetic antenna 106 is to be operated only at a frequency or a range of small relative bandwidth, the magnetic antenna 106 can be significantly increased in efficiency by means of a resonance capacitance. The current flow in the loop 108 increases to the extent of the resonance increase (expressed by the quality factor Q), i.e. double Q causes double current flow (and hence double magnetic field (only works with the root at P=const.; only at U=const. would it work linearly) for the same power fed in. Thus, it is desirable to achieve as high a Q-factor as possible, which means that both the loop 108 and the capacitance needs to have as low losses as possible. As a rule, the losses in the loop 108 predominate due to the finite conductivity of the metal used (usually Cu).

Figure 2:
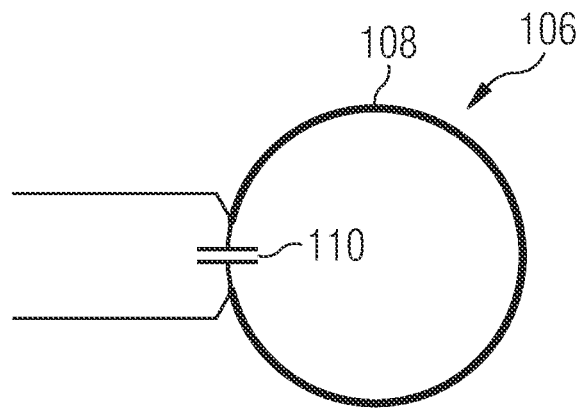
FIG. 2 is a schematic view of a magnetic antenna.

FIG. 2 shows a schematic view of such a magnetic antenna 106. As mentioned above, the magnetic antenna 106 includes the loop 108 having one or several turns and the resonance capacitance 110 (C0). Here, the magnetic antenna 106 can be coupled to, for example, the transmitting and/or receiving means 102 (see FIG. 1) via the parallel resonant circuit formed by the resonance capacitance 110 and the loop 108 (coil).

The magnetic antenna 106 has the advantage of a high antenna quality with a small design.

In addition, the magnetic antenna 106 has the advantage that the same can be adapted to different environmental conditions, e.g. by automatic tuning.

Thus, embodiments of the present invention relate to a sensor node having a magnetic antenna. Here, the magnetic antenna can be automatically tuned.

1.2 Multiple Shortening of the Loop of the Magnetic Antenna

Figure 3:
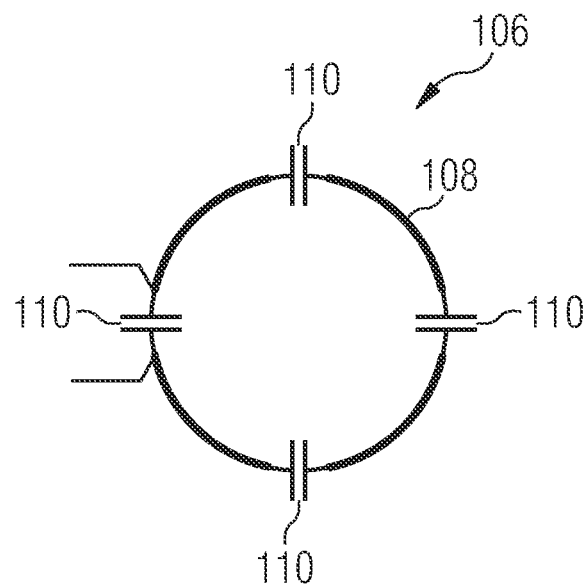
FIG. 3 is a schematic view of a magnetic antenna having a loop interrupted several times (e.g. capacitively shortened), according to an embodiment of the present invention.

FIG. 3 shows a schematic view of a magnetic antenna 106 having a loop 108 interrupted several times (e.g., capacitively shortened). As shown exemplarily in FIG. 3, the loop 108 can be divided into four segments by four capacitance elements 110 (4C0), such as resonance capacitances (e.g., resonance capacitors). However, it should be noted that the loop 108 of the magnetic antenna 106 can also be divided into a different number of segments. Thus, in embodiments, the loop 108 of the magnetic antenna 106 can be divided into n segments by n capacitance elements 110, wherein n is a natural number greater than or equal to two.

In embodiments, the loop 108 of the magnetic antenna can be divided into equidistant segments. Dividing the loop 108 into equidistant segments has the advantage that, overall, the lowest E-field portions are obtained. Obviously, the loop can also be divided into non-equidistant segments.

The lower electric fields or the multiple capacitive shortening have the advantage that dielectric material in the direct vicinity of the antenna detunes the same correspondingly less in its resonance frequency.

Further, the lower electric fields or the multiple capacitive shortening have the advantage that dielectric, lossy material in the direct vicinity of the antenna reduces its quality factor less.

Further, the lower electric fields or the multiple capacitive shortening have the advantage that the voltage at the resonance capacitances is correspondingly lower (e.g. half the voltage with double shortening, but then also double the capacitance value). This is particularly advantageous if one or several of the resonance capacitances are to be tunable, as the tuning elements can then have a lower electric strength.

In embodiments, the magnetic antenna 106 (or the loop 108 of the magnetic antenna 106) can be capacitively shortened several times.

In embodiments, a plurality of capacitors 110 are serially disposed in the magnetic loop.

1.3 Special Configuration of the Loop of the Magnetic Antenna

Loops 108 with a round shape have the best ratio of the length of the conductive trace to spanned (or enclosed) area. However, the use of space on a usually rectangular board (conductive traces) is not optimal.

Figure 4:
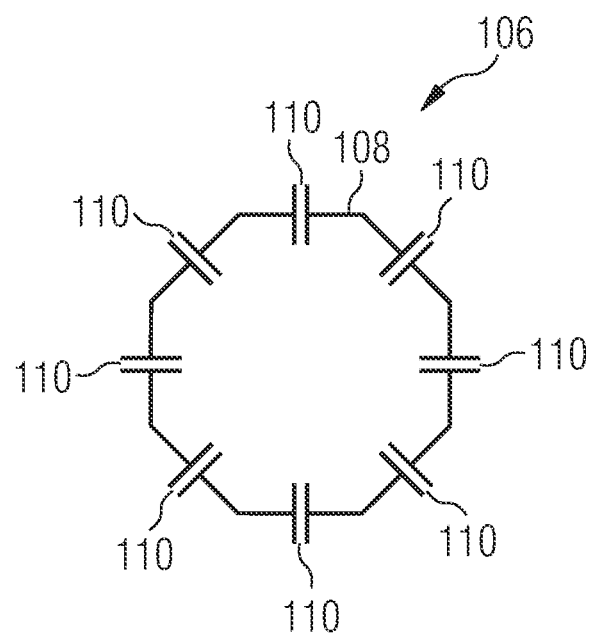
FIG. 4 is a schematic view of a magnetic antenna having a loop interrupted several times, wherein the loop is octagonal, according to an embodiment of the present invention.

Shapes having more than four corners, especially the octagonal shape, offer advantages in this regard. Although the ratio of area to circumference and thus the quality of the magnetic antenna 106 decreases, the efficiency of the magnetic antenna 106 increases for a given rectangular board area, since the spanned (or enclosed) area becomes larger. FIG. 4 illustrates a symmetrical configuration (of the loop 108) of the magnetic antenna 106, but asymmetrical configurations (of the loop 108) are also possible, where, for example, the upper and lower portions (e.g., segments of the loop 108) are longer.

In detail, FIG. 4 shows a schematic view of a magnetic antenna 106 having a loop 108 interrupted several times, wherein the loop 108 is octagonal.

As shown exemplarily in FIG. 4, the loop 108 can be divided into eight segments by (e.g., eight) capacitance elements 110, wherein the eight segments can be angular, such that the loop 108 has an octagonal shape. However, it should be noted that the loop 108 can also be divided into a different number of segments and/or have a different shape. For example, in embodiments, the loop 108 of the magnetic antenna can be m-corner shaped, where m is a natural number greater than or equal to three, such as 3, 4, 5, 7, 8, 9, 10, 11 or 12.

In embodiments, the magnetic antenna 106 can be implemented on a printed circuit board (PCB).

In embodiments, the magnetic antenna 106 (or the loop 108 of the magnetic antenna 106) can have sections (or segments) that are not round.

In embodiments, a wiring of the segments of the magnetic antenna 106 (or the loop 108 of the magnetic antenna 106) can be straight in the areas (or at the locations) with members.

In embodiments, the magnetic antenna 106 (or the loop 108 of the magnetic antenna 106) can have a polygonal shape or more than four corners.

Such a magnetic antenna 106 has the advantage that the layout is more easily transferable to different layout programs.

Further, such a magnetic antenna 106 has the advantage that placing the members is easier, since at the locations with the members, the wiring (of the loop 108 of the magnetic antenna 106) is straight.

In some embodiments, the diagonally extending sides (segments of the loop 108 of the magnetic antenna 106) can have a circular arc shape instead of an angular shape to further increase the area and make the best use of the board area. In return, the advantages of easier component placement and simple layout would be lost.

Although the antenna arrangement 104 shown in FIG. 4 includes a magnetic antenna 106 having a loop 108 interrupted several times, it should be noted that the described embodiments are equally applicable to an antenna arrangement 104 having a magnetic antenna 106 having a loop 108 interrupted once (cf. FIG. 1a).

1.4. The Loop is Realized on a Circuit Board

In embodiments, the loop can be realized on a printed circuit board (PCB).

In embodiments, the tuning circuit can be realized on the same circuit board printed circuit board).

1.5. Several Antennas

In embodiments, the antenna arrangement 104 can comprise several magnetic antennas.

This has the advantage that the zero point (e.g. points in the antenna pattern where the radiation energy of the magnetic antenna is practically zero) of a magnetic antenna can be bypassed.

1.5.1 Crossed Field Loop with Diversity

In embodiments, two magnetic antennas can be used, wherein the two magnetic antennas are (e.g., substantially) orthogonal.

1.5.2 Flattened Second Loop to Get Out of Zero Point

To get the flattest possible case, the second magnetic antenna (or the loop of the second magnetic antenna) can be "flattened". Loops that are not round increase the resistance of the winding in comparison to the stretched (or enclosed) area, which reduces the quality. Since the flattened loop has a smaller surface area, its radiation efficiency decreases. This increases the Q factor slightly, but does not contribute to the radiation. To compensate at least partially for the first quality-reducing effect, a wider conductor (lower loss) can be used.

Figure 5:
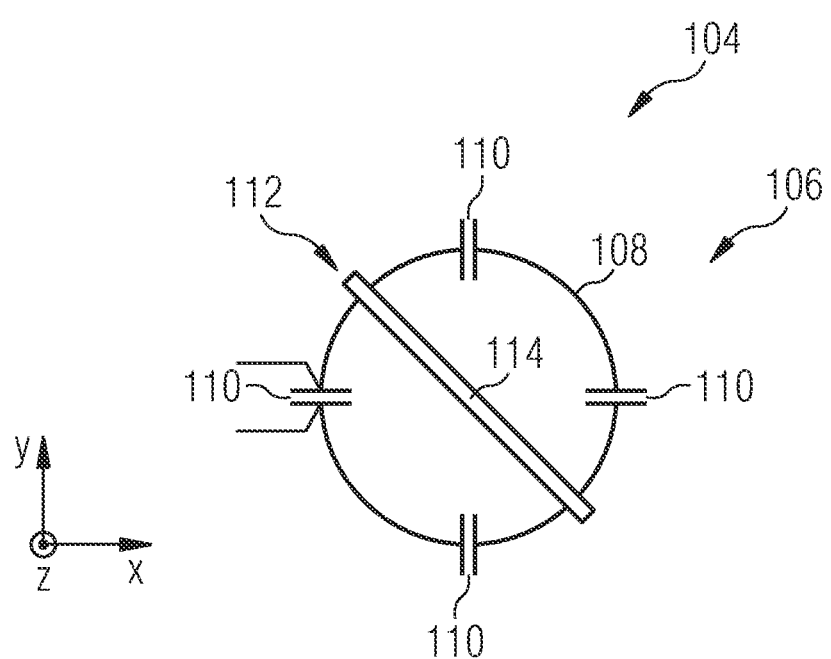
FIG. 5 is a schematic view of an antenna arrangement comprising a first magnetic antenna and a second magnetic antenna, according to an embodiment of the present invention.

FIG. 5 shows a schematic view of an antenna arrangement 104 having a first magnetic antenna 106 and a second magnetic antenna 112, according to an embodiment of the present invention.

The first magnetic antenna 106 includes a loop 108 interrupted several times. As shown exemplarily in FIG. 5, the loop 108 of the first magnetic antenna can be divided into four segments by four capacitance elements 110. However, it should be noted that the loop 108 of the first magnetic antenna 106 can also be divided into a different number of segments. For example, in embodiments, the loop 108 of the first magnetic antenna 106 can be divided into n segments by n capacitance elements 110, wherein n is a natural number greater than or equal to two.

The second magnetic antenna 112 also includes a loop 114, wherein the loop 108 of the first magnetic antenna 106 and the loop 114 of the second magnetic antenna 112 can be substantially orthogonal to each other.

As shown exemplarily in FIG. 5, an area spanned by the loop 114 of the second magnetic antenna 112 is orthogonal to an area spanned by the loop 108 of the first magnetic antenna 106. In detail, in FIG. 5, the area spanned by the loop 108 of the first magnetic antenna 106 runs parallel to the xy-plane defined by the coordinate system, while the area spanned by the loop 114 of the second magnetic antenna 112 runs parallel to or in the z-axis of the coordinate system.

In embodiments, a spanned (or enclosed) area of the loop 114 of the second magnetic antenna 112 can be smaller than a spanned (or enclosed) area of the loop 108 of the first magnetic antenna 106 by at least a factor of two (e.g., a factor of three, four, five, or ten).

In other words, the loop 114 of the second magnetic antenna 112 can be "flattened".

As further indicated in FIG. 5, in embodiments, a conductor of the loop 114 of the second magnetic antenna 112 can be thicker or wider than a conductor of the loop 108 of the first magnetic antenna 106 by at least a factor of two (e.g., a factor of three, four, or five).

Obviously, the loop 114 of the second magnetic antenna 112 can also be interrupted several times, for example by at least two capacitance elements.

In embodiments, the antenna arrangement 104 can include a second loop 114 that is orthogonal.

In embodiments, a wire thickness/width of the second loop 114 can be greater (than a wire thickness/width of the first loop 108), however, the second loop 114 can be flatter (than the first loop 108).

Although the antenna arrangement 104 shown in FIG. 5 comprises magnetic antennas with loops interrupted several times, it should be noted that the described embodiments are equally applicable to an antenna arrangement having magnetic antennas with loops interrupted once.

1.5.3 Combined Magnetic/Electric Antenna to Come Out of Zero Point

In order to circumvent the zero point (e.g., points in the antenna pattern where the radiation energy of the magnetic antenna is practically zero) of the magnetic antenna 106, an electric antenna can be integrated on the printed circuit board (e.g., PCB) in addition to the magnetic antenna 106, e.g., in the form of a PCB F-antenna, as an "extension" of the loop 108 (e.g., the magnetic ring/octagon).

In embodiments, an electric antenna and a magnetic antenna can be combined (e.g., on a printed circuit board (e.g., PCB)).

1.5.4. Switching the Loops

If several magnetic loops (or magnetic antennas) are combined without further measures, a new zero point is obtained from a different direction.

Therefore, using several magnetic loops (or several magnetic antennas) only makes sense if the unused loop(s) (or magnetic antenna(s)) can be turned off.

1.5.4.1 Switching Off by Interrupting the Resonance Current

In embodiments, the current flow of the undesired magnetic antenna can be interrupted, for example, by means of a switch. However, since each switch has some residual capacitance, this ultimately amounts to strong detuning of the resonance frequency.

1.5.4.2 Switching Off by Additional Inductance (L)

In embodiments, one or several resonance capacitors can be provided in parallel with a coil. These form a parallel resonant circuit at the original resonance frequency of the loop, which interrupts the current flow therein.

1.5.4.3 Changing the Control Ratio

In embodiments, by slight detuning of the self-resonance of one of the two loops, tuning of the loops and thus the main radiation direction and thus the zero point can be shifted, since the loops then radiate differently at unchanged high control powers. The part of the slightly detuned loop that is not radiated is reflected back and absorbed in the transmitter.

1.5.4.4 Phase-Shifted Control of Mag. Loops

The zero point of a loop depends on its structure in the three-dimensional space. The same does not change, if, for example, only the capacity of a resonance capacitance is changed. Therefore, for planar loops, there is a position where the same do not penetrate B-field lines, namely when the same run in the plane of the loop. But even in the case of a three-dimensional loop (or curved B-lines), e.g. in the case of a slightly bent circular ring which does not run exactly in a plane, there is a position where field lines penetrating from one side and from the other side of the loop are in balance. This results in a compensation, i.e. a zero point. Even orthogonal loops would have a zero point at 45° if their signals were only directly interconnected. To avoid this, their receive signals can be combined at 90° phase shift, because then no geometrical cancellation of the time signals is possible.

In embodiments, several magnetic loops can be controlled in a phase-shifted manner.

In embodiments, several self-tuned magnetic loops can be controlled in a phase-shifted manner.

1.5.5. Variation of the Radiation Ratio Over the Hop Number

In connection with the telegram splitting transmission method [6], transmission diversity (i.e. transmission with different antennas) can be performed for each telegram, since, in the telegram splitting transmission method, it is possible to transmit each sub-data packet (hop) on a different antenna/with different strengths on the antennas.

This has the advantage that the transmission reliability of a telegram can be increased.

Thus, in embodiments, different sub-data packets (hops) can be radiated at different strengths on different antennas, such that different sub-data packets are transmitted with different antenna zero points.

1.5.5.1. Implementation of the Loop where the Zero Point Depends on the Frequency In embodiments, more or less orthogonal loops with different resonant frequencies can be used, whose signals are combined, for example, by a decoupled combiner. If the resonance frequencies are close to each other, the loops need already to have good geometric orthogonality (i.e. magnetic decoupling). Otherwise, there will be quality losses and resonance distortions. Therefore, the resonance frequency is slightly detuned on purpose. Different sub-data packets (hops) are at different frequencies and are therefore transmitted with different strengths by the loops with different resonances, so the zero point of the mag. antenna is shifted in each case.

In embodiments, the radiation ratio of the magnetic antennas changes across the frequency.

In embodiments, the zero point of the antenna shifts across the frequency.

2. Generation of a Tuning Signal

Figure 6A:
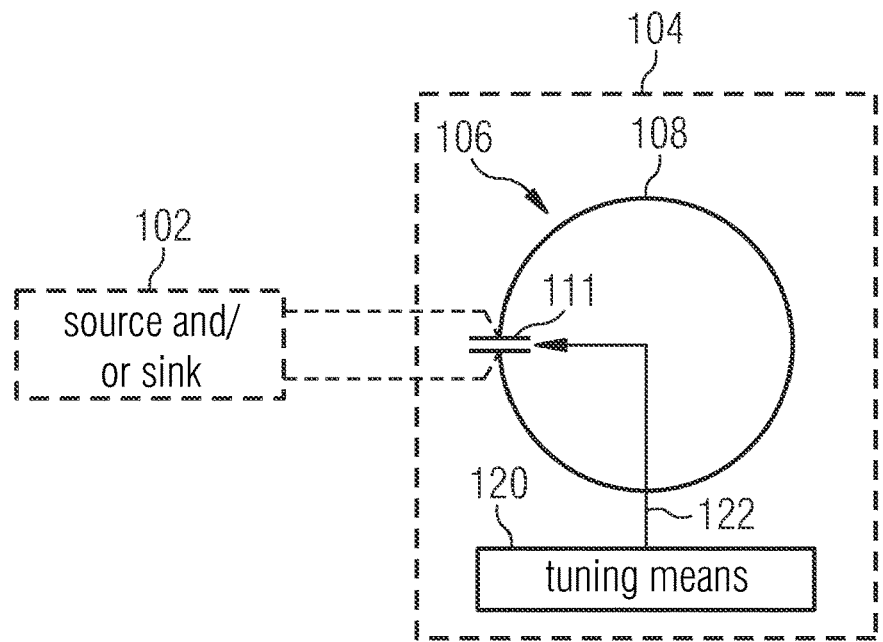
FIG. 6a is a schematic block diagram of an antenna arrangement, according to an embodiment of the present invention.

FIG. 6a shows a schematic block diagram of an antenna arrangement 104 according to an embodiment of the present invention.

The antenna arrangement 104 includes a magnetic antenna 104 having a loop 108 interrupted one time (i.e., only one) and a tuning element 111 for tuning the magnetic antenna 104.

The tuning means 120 is configured to provide a tuning signal (e.g., a control signal) 122 for tuning the magnetic antenna 106, and to control the tuning element 111 with the tuning signal 122 to tune the magnetic antenna 106.

In embodiments, the loop 108 of the magnetic antenna can be interrupted by the tuning element 111, wherein the tuning element 111 can be a variable (or adjustable) capacitance (e.g., variable resonance capacitance). For example, the tuning element 111 can be a variable capacitor or a capacitance diode.

Figure 6B:
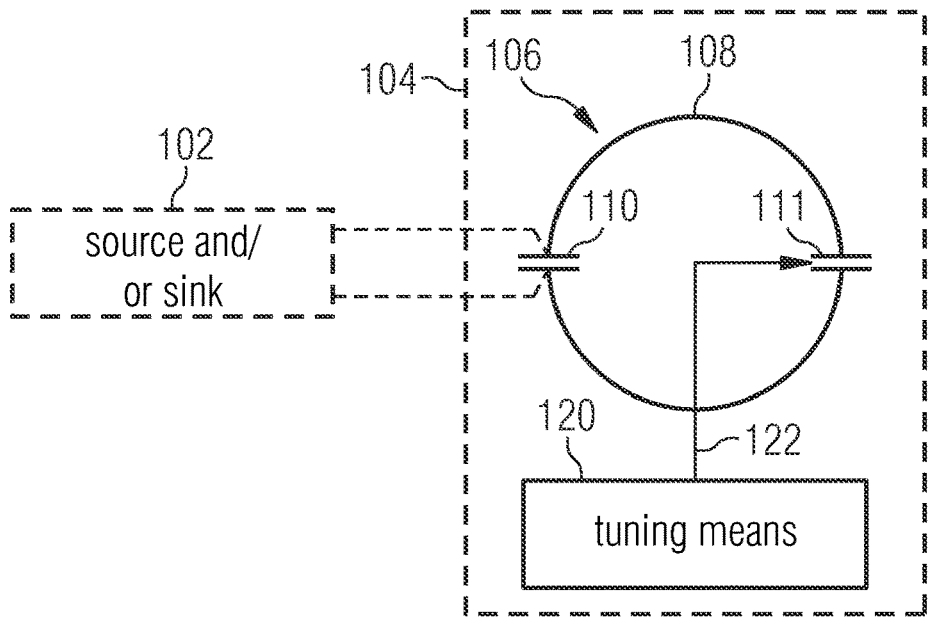
FIG. 6b is a schematic block diagram of an antenna arrangement, according to an embodiment of the present invention.

FIG. 6b shows a schematic block diagram of an antenna arrangement 104 according to an embodiment of the present invention.

The antenna arrangement 104 includes a magnetic antenna 104 having a loop 108 interrupted several times and at least one tuning element 111 for tuning the magnetic antenna 104.

The tuning means 120 is configured to provide a tuning signal (e.g., control signal) 122 for tuning the magnetic antenna 106, and to control the tuning element 111 with the tuning signal 122 to tune the magnetic antenna 106.

In embodiments, the loop 108 of the magnetic antenna 106 can be interrupted several times by capacitance elements 110, such as resonance capacitances (resonance capacitors). For example, as shown in FIG. 6b for illustrative purposes, the loop 108 of the magnetic antenna 106 can be interrupted (e.g., capacitively shortened) twice by two capacitance elements 110. However, it should be noted that in embodiments, the loop 108 of the magnetic antenna 106 can also be interrupted several times by a different number of capacitance elements 110. Thus, in embodiments, the loop 108 of the magnetic antenna 106 can be divided into n segments (or parts, or sections) by n capacitance elements 110, wherein n is a natural number greater than or equal to two. As used herein, segments are the parts or sections of the loop 108 between the respective capacitance elements 110.

Here, the at least one tuning element 111 can be one of the capacitance elements 110, wherein the tuning element 111 can be configured as a variable capacitance element, such as a variable resonance capacitance. For example, the tuning element 111 can be a variable capacitor or a capacitance diode. Obviously, a true subset or all of the capacitance elements 110 can also be tuning elements 111, such as variable capacitance elements (e.g., variable capacitors or capacitance diodes). In other words, there can also be several tuning elements, such as capacitance diodes, such as at n−1 of n interruptions.

As indicated exemplarily in FIGS. 6a and 6b, the antenna arrangement 104 can be connected to a source and/or sink 102, such as transmitting and/or receiving means (e.g., of a participant 100 of a communication system). However, it should be noted that embodiments of the present invention primarily relate to the antenna arrangement 104, which can be implemented in a variety of different fields of application.

In embodiments, a loop circumference of the loop interrupted one or several times can be ½ to ¹/₁₀ of a wavelength of the signal advancing into the magnetic antenna or of a transmitting signal to be transmitted by the magnetic antenna or a receiving signal received by the magnetic antenna. For example, the wavelength can be less than or equal to 1.999 m (e.g., at frequencies greater than or equal to 149 MHz), or less than or equal to 0.749 m (e.g., at frequencies greater than or equal to 400 MHz), or less than or equal to 0.375 m (e.g., at frequencies greater than or equal to 800 MHz).

In embodiments, a frequency of the signal advancing into the magnetic antenna or a transmitting signal to be transmitted with the magnetic antenna or a receiving signal to be received with the magnetic antenna can be greater than or equal to 149 MHz, 400 MHz, or 800 MHz, or can be in the range of 149 MHz to 930 MHz.

In embodiments, a frequency of the signal advancing into the magnetic antenna or a transmitting signal to be transmitted with the magnetic antenna or a receiving signal to be received with the magnetic antenna can be within an ISM band (ISM=Industrial, Scientific and Medical) or SRD band (SRD=Short Range Device) band, such as in the range of 169.4000 to 169.8125 MHz, or in the range of 433.05 MHz to 434.79 MHz, or in the range of 863 to 870 MHz, or in the range of 902 to 928 MHz.

In embodiments, the magnetic antenna can be narrowband. For example, in embodiments, the magnetic antenna can have a Q of 20 to 500. (Note: In magnetic antennas, the bandwidth is defined by the Q).

With respect to its usable bandwidth, a magnetic antenna can be considered in a first approximation as a resonant circuit, which has, at the resonance point at the frequency $\omega_0=2\pi f_0$, by definition, a capacitive as well as inductive reactive component of equal magnitude:

$$X_C = \frac{1}{\omega_0 C} = X_L = \omega_0 L := X_0$$

The losses of the antennas can be combined in a parallel or serial loss resistor $R_p$ or $R_s$ wherein both substitution models can be converted into each other according to $R_p R_s = X_0^2$. Few losses mean a high $R_p$ or a low $R_s$. The quality Q is the dimensionless quantity $$Q = \frac{R_p}{X_0} = \frac{X_0}{R_s},$$

which increases with decreasing losses. The usable bandwidth $\Delta\omega$ of a magnetic antenna is generally defined as the value $$\Delta\omega = \frac{\omega_0}{Q}$$

Thus, the same decreases as the quality increases.

In principle, a high quality is aimed for, because a correspondingly higher resonance current occurs for the same power fed in, which in turn is directly proportional to the height of the desired magnetic field. However, a distinction is to be made between two effects:

1) Quality loss due to losses of the antenna elements themselves. These are essentially given by the losses of the conductor material (usually Cu). This loss resistance, which can be considered e.g. in series, can be determined via the reduced conductor cross-section due to the skin effect and the conductor length according to the known laws. In the case of a strongly irregularly shaped conductor cross-section, the current distribution in the same also plays a part. In comparison, the predominantly dielectric losses in the resonant capacitor(s) are negligible as long as sufficiently high-quality capacitors are used.

2) Quality loss due to the radiation of the antenna ("radiation losses"). This effect is desirable. In the model, the same are called (serial) radiation resistance $R_s$ and are calculated for loop antennas consisting of one turn without the addition of ferromagnetic material, with a circumference of $$U \ll \frac{\lambda_0}{4}$$

according to [8]

$$R_S = \frac{\pi}{6} Z_0 \left(\frac{U}{\lambda_0}\right)^4$$

Here, $Z_0 = 120\pi\Omega$ is the characteristic impedance of the vacuum and $\lambda_0$ the vacuum wavelength at the resonance frequency. Doubling the loop diameter therefore means 16 times higher $R_s$. The smaller the radiation resistance $R_s$, the more the losses of the antenna elements become important. But even with an ideally loss-free antenna, the problem remains of then having to match a very small value $R_s$ to the source impedance of the transmitter (usually about 50 ohms). The losses of the needed matching network then become more and more important. In the end, almost the entire fed-in power goes into the matching network. An example: A loop with $$U \ll \frac{\lambda_0}{8}$$

has a radiation resistance or only 0.048 ohm.

Even if this formula does not apply exactly to larger antennas, which do not meet the above prerequisite $$U \ll \frac{\lambda_0}{4},$$

an increase in diameter or circumference nevertheless causes an increase of the radiation resistance.

Detailed embodiments of generating the tuning signal 122 (e.g., tuning control variable or tuning voltage) are described below.

Although in the following embodiments reference is sometimes made to a magnetic antenna 106 having a loop 108 interrupted once and sometimes to a magnetic antenna 106 having a loop 108 interrupted several times, it should be noted that these embodiments are equally applicable to the respective other configuration of the magnetic antenna 106.

Figure 7:
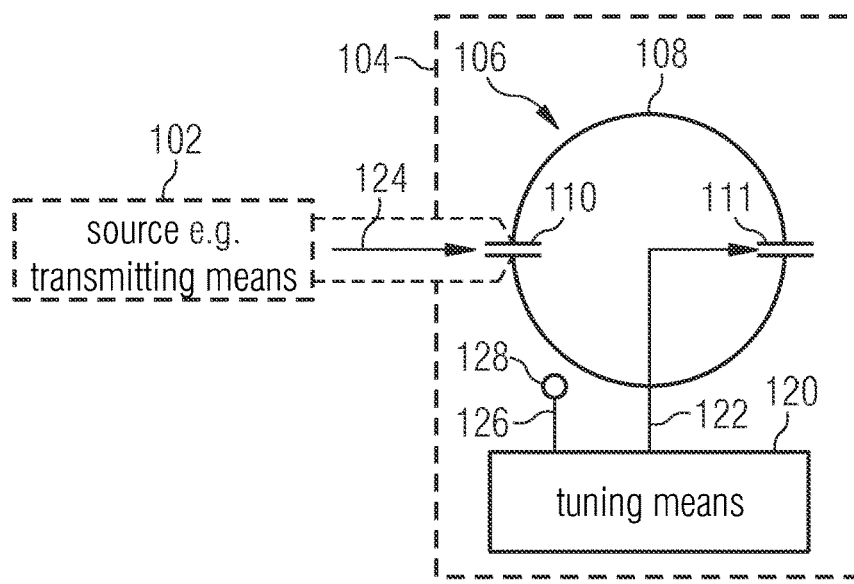
FIG. 7 is a schematic block diagram of an antenna arrangement, according to an embodiment of the present invention.

2.1. Generation of a Tuning Signal (e.g. Tuning Voltage) by Phase Evaluation FIG. 7 shows a schematic block diagram of an antenna arrangement 104 according to an embodiment of the present invention. The antenna arrangement 104 includes the magnetic antenna 106 with the tuning element 111, and the tuning means 120 for tuning the magnetic antenna 106.

The tuning means 120 is configured to provide the tuning signal 122 for tuning the magnetic antenna 106 in dependence on a phase position of a signal 124 (e.g., advancing power or advancing wave) advancing into the magnetic antenna 106, and to control the tuning element 111 with the tuning signal 122 to tune the magnetic antenna 106.

In embodiments, the tuning means 120 can be configured to provide the tuning signal 122 for tuning the magnetic antenna 106 in dependence on a phase relationship between the signal 124 (e.g., advancing power) advancing into the magnetic antenna and a phase signal 126.

The phase signal 126 can be based on a current flowing in at least a portion of the loop 108 and/or a magnetic field (e.g., in the near field) generated by the loop 108 or magnetic antenna 106.

The phase signal 126 can be a power coupled out of the magnetic antenna 106 (e.g., inductively).

For example, the antenna arrangement 104 can include a coupling loop 128 configured to couple power out of the magnetic antenna 106 to obtain the power coupled out of the magnetic antenna (e.g., inductively). The loop 108 of the magnetic antenna 106 and the coupling loop 128 can be disposed or implemented on the same printed circuit board.

In embodiments, the tuning means 120 can be configured to control the tuning element 111 with the tuning signal 122 to regulate a phase difference between the signal 124 (e.g., advancing power or advancing wave) advancing into the magnetic antenna and the phase signal 126 to a predetermined set value.

For example, the tuning means can be configured to regulate the phase difference between the signal 124 (e.g., advancing power) advancing into the magnetic antenna and the phase signal to the predetermined set value by controlling the tuning element with the control signal.

For example, the tuning means can be configured to track the control signal to counteract a deviation of the phase difference between the signal 124 (e.g., advancing power) advancing into the magnetic antenna and the phase signal from the predetermined set value.

In embodiments, the tuning means can be configured to effect regulation of the phase difference between the signal 124 (e.g., advancing power) advancing into the magnetic antenna and the phase signal toward the predetermined set value using a control loop or feed-forward control.

In the following, the mode of operation of the embodiment of generating the tuning signal 122 shown in FIG. 7 will be described in detail.

The transmission measurement of a resonant circuit has a magnitude maximum and a phase turning point at the resonance point. Depending on the degree of coupling of the feeding source with the circuit, the same can lie between 90° (loose coupling, see [1]) and 0° (fixed coupling, see [2] or FIG. 8).

Figure 8:
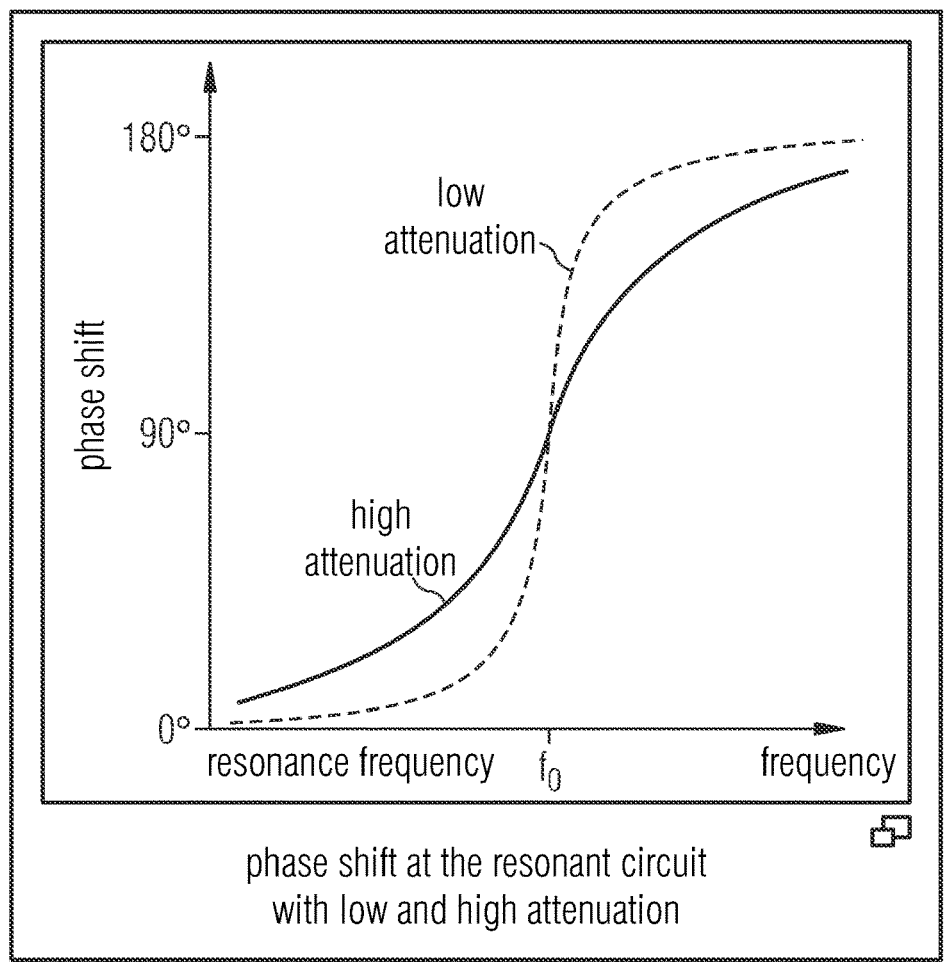
FIG. 8 shows, in a diagram, phase responses of a resonant circuit from [1] with low attenuation and high attenuation.

FIG. 8 shows in detail phase responses of a resonant circuit of [1] with low attenuation and high attenuation. In FIG. 8, the ordinate describes the phase shift in degrees and the abscissa the frequency.

The phase response is a monotonically increasing arctan-function, which runs from a value $\varphi 0$ (at f=0) to a value $\varphi 0+180°$ (at f→∞) (see FIG. 8). The value at resonance is then $\varphi R=\varphi 0+90°$ and is a turning point. Sometimes the phase is counted with a negative sign, in which case the above applies accordingly (monotonically increasing becomes monotonically decreasing etc., (see [2]).

Embodiments exploit this fact for automatic frequency readjustment by comparing the phase position of the signal 124 (e.g., advancing power) advancing into the loop 108 with a power inductively coupled out of the loop 108, e.g., via a small coupling loop 128. A directional coupler, for example, can be used to determine the phase position of the advancing signal 124 (e.g., advancing power). In addition, a further phase offset occurs across different line lengths to the location where the phase comparator is located on the circuit board. In some embodiments, a phase shifter $\Delta\varphi 0$ is therefore inserted into one of the two lines running to the phase comparator, so that in the event of resonance the two signals have a phase difference of, for example, exactly 90°.

Phase comparators are sufficiently known from the literature. The Gilbert cell frequently used for this purpose (see [4]) basically acts like a multiplier. Two sinusoidal time signals with a phase shift $\Delta\varphi$ deviating by 90° result in the following output signal after multiplication:

$$\sin(\omega t+\Delta\varphi)\cos(\omega t)=\frac{1}{2}[\sin(\Delta\varphi)+\sin(2\omega t+\Delta\varphi)]$$

Figure 9:
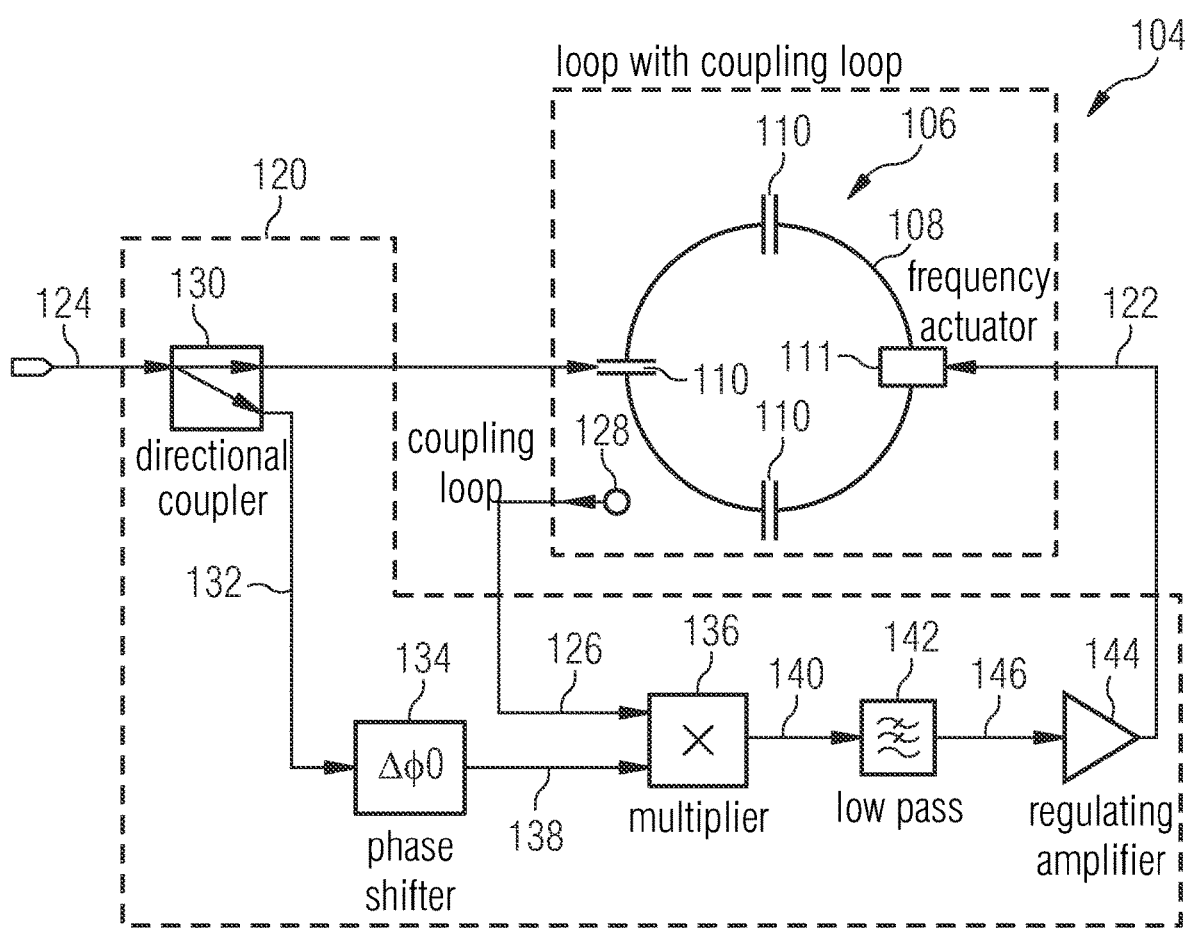
FIG. 9 is a schematic block diagram of an antenna arrangement, according to an embodiment of the present invention.

(here, for simplicity the amplitudes are normalized to 1). The part with the double frequency $2\omega t$ can easily be faded out with a low-pass, so that the DC component ~sin (4) remains. Since the sine function is an odd function, the result is a regulation quantity that changes its sign around the operating point of 90° and is zero only at exactly 90°. If the control loop is closed with the correct sign, the resonance frequency of loop 108 is thus readjusted due to the quasi-infinitely high regulation amplification until the voltage at the multiplier output disappears, which is equivalent to the two voltages at the multiplier input having a 90° phase shift. According to the above, the loop 108 then resonates at the input frequency. FIG. 9 shows a block diagram of the arrangement described. The phase shifter is drawn here in the output path of the directional coupler. As already mentioned, it can also be looped into the path of the coupling loop. This can be chosen so that the respective smaller phase shift is needed.

In detail, FIG. 9 shows a schematic block diagram of an antenna arrangement 108, according to an embodiment of the present invention. The antenna arrangement 108 comprises the magnetic antenna 106 and the tuning means 120.

As shown in FIG. 9, the tuning means 120 can be configured to derive (e.g., branch off) a signal 124 from the signal 124 (e.g., advancing power) advancing into the magnetic antenna 106 to provide a derived (e.g., branched-off) signal 132. Here, the tuning means 120 can be configured to provide the tuning signal 122 for tuning the magnetic antenna 106 in dependence on a phase relationship between the derived signal 132 and the phase signal 126.

For example, the tuning means 120 can be configured to control the tuning element 111 with the tuning signal 122 to regulate the phase difference between the derived signal 132 and the phase signal 126 to a predetermined set value.

In embodiments, the tuning means 120 can further comprise a signal combiner 136 (e.g., multiplier or subtractor) configured to combine (1) the phase signal 126 or a phase-shifted version of the phase signal, and (2) the derived signal 132 or a phase-shifted version 138 of the derived signal 132, to obtain a combined signal 140. Here, the tuning means 120 can be configured to control the tuning element 111 with the tuning signal 122 to regulate (1) a DC component of the combined signal 140 or (2) a low-pass filtered version 146 of the combined signal 140 to a predetermined set value.

In embodiments, the tuning means 120 can further comprise a phase shifter 134 that can be configured to phase shift one of the derived signal 132 and the phase signal 126 to obtain a phase-shifted signal 138. The signal combiner (e.g., multiplier or subtractor) 136 can be configured to combine the phase shifted signal 138 and the other one of the derived signal 132 and the phase signal 126 to obtain a combined signal 140. Here, the phase shifter 134 can be configured to phase shift the one of the derived signal 132 or the phase signal 126 such that, when the magnetic antenna 106 resonates, the phase shifted signal 138 and the other one of the derived signal 132 and the phase signal 126 have a pre-defined phase difference (e.g., 90°±3° or ±1° or 0.1°) at the signal combiner 136.

In the embodiment shown in FIG. 9, the phase shifter 134 is exemplarily configured to phase shift the derived signal 132 to obtain the phase shifted signal 138, in which case the signal combiner 136 can be configured to combine the phase shifted signal 138 and the phase signal 126 to obtain the combined signal 140. According to another embodiment, the phase shifter 134 can be configured to phase shift the phase signal 126 to obtain the phase shifted signal 138, in which case the signal combiner 136 can be configured to combine the phase shifted signal 138 and the derived signal 132 to obtain the combined signal 140.

In embodiments, the tuning means can further comprise an energy decoupler 130 (e.g., a directional coupler or other apparatus for coupling out energy) that can be configured to couple out a portion of the signal 124 (e.g., advancing power) advancing in the magnetic antenna 106 to obtain the derived signal 132.

In embodiments, the tuning means 120 can further comprise a regulating amplifier 144 configured to provide the tuning signal 122 (e.g., control signal) for tuning the magnetic antenna 106, wherein the regulating amplifier 144 can be configured to control the tuning element 111 with the tuning signal 122 to regulate (1) a DC component of the combined signal 140 or (2) a low-pass filtered version 146 of the combined signal 140 to a predetermined set value.

In embodiments, the tuning means 120 can further comprise a low-pass filter 142 that can be configured to low-pass filter the combined signal 140 to obtain a low-pass filtered signal 146 comprising the DC component of the combined signal 140.

In other words, FIG. 9 shows a block diagram for automatic frequency regulation using evaluation of the transmitted phase. In general, the regulating amplifier 144 can be an I controller or a PI controller. Particularly in frequency hopping systems [6], care has to be taken to ensure that its settling time is short enough. This can be achieved by selecting a correspondingly short regulating time constant (e.g. 0 μs).

Various configurations for the directional coupler 130 shown in FIG. 9 are known in the literature. One of them can be found in [5, page 88, FIG. 7.3] in a specific configuration. It is shown here in FIG. 10a in general form.

Figure 10A:
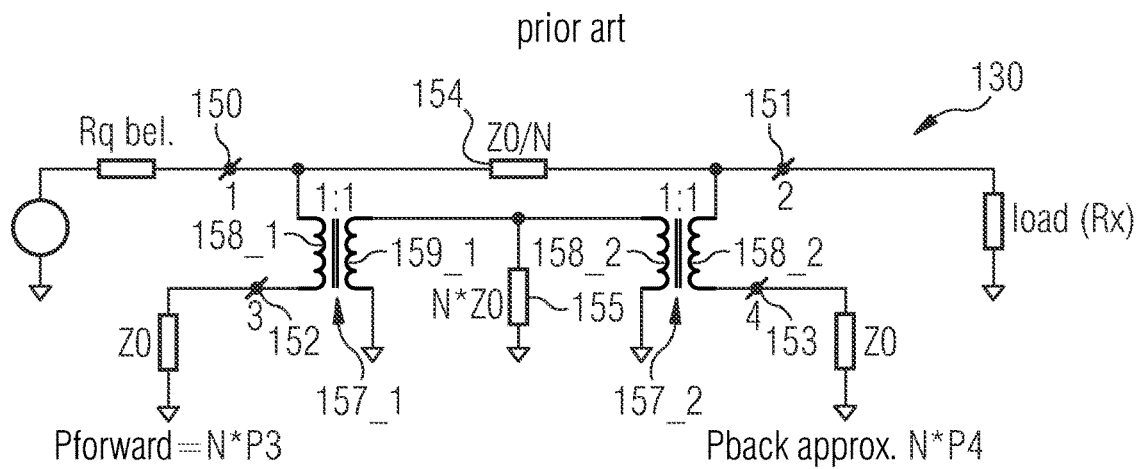
FIG. 10a is a schematic block diagram of a conventional directional coupler.

In detail, FIG. 10a shows a schematic block diagram of a conventional directional coupler 130. The directional coupler 130 includes a first terminal 150, a second terminal 151, a third terminal 152, and a fourth terminal 153. Further, the directional coupler 130 includes a first resistor 154 (e.g., of size Z0/N) connected between the first terminal 150 and the second terminal 151, and a second resistor 155 connected between an intermediate node between two transformers 157_1 and 157_2 and ground. The first transformer 157_1 includes a first coil 158_1 connected between the first terminal 150 and the third terminal 152, and a second coil 159_1 connected between the intermediate node and ground. The second transformer 157_2 includes a first coil 158_2 connected between the second terminal 151 and the fourth terminal 153, and a second coil 159_2 connected between the intermediate node and ground.

In contrast to the directional coupler 130 with two transformers shown in FIG. 10a, embodiments of the present invention provide a directional coupler 130 with only one transformer (reduced number of transformers). Embodiments of the directional coupler 130 with only one transformer are shown in FIGS. 10b and 10c.

Figure 10B:
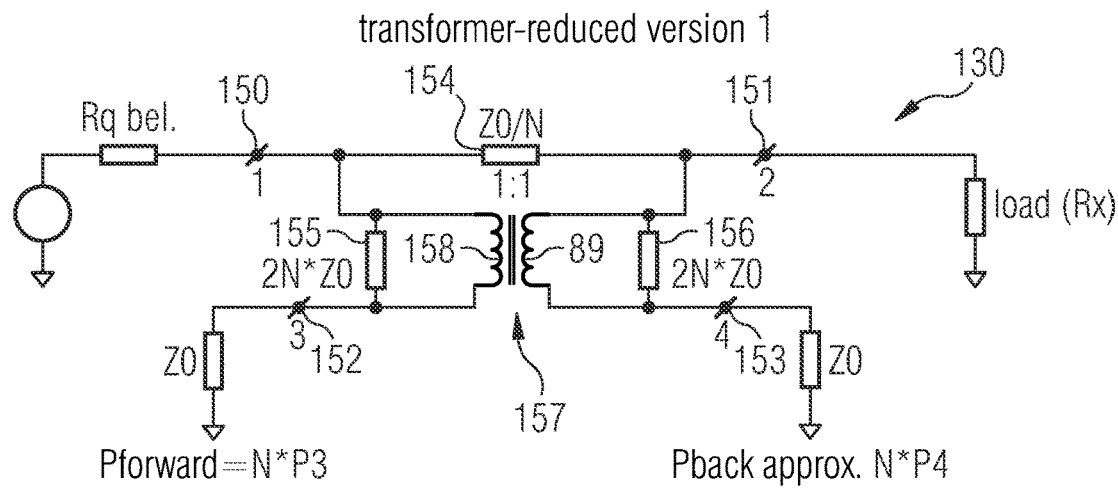
FIG. 10b is a schematic block diagram of a directional coupler, according to an embodiment of the present invention.

FIG. 10b shows a schematic block diagram of a directional coupler 130 according to an embodiment of the present invention. The directional coupler 130 includes a first terminal 150, a second terminal 151, a third terminal 152, and a fourth terminal 153. Further, the directional coupler 130 includes a first resistor 154 (e.g., of size Z0/N) connected between the first terminal 150 and the second terminal 151, a second resistor 155 (e.g., of size 2N*Z0) connected between the first terminal 150 and the third terminal 152, and a third resistor 156 (e.g., of size 2N*Z0) connected between the second terminal 151 and the fourth terminal 153. Further, the directional coupler 130 comprises a transformer 157, wherein a first coil 158 of the transformer 157 is connected between the first terminal 150 and the third terminal 152, and wherein a second coil 159 of the transformer 157 is connected between the second terminal 151 and the fourth terminal 153. The first coil 158 and the second coil 159 can have the same number of windings.

Figure 10C:
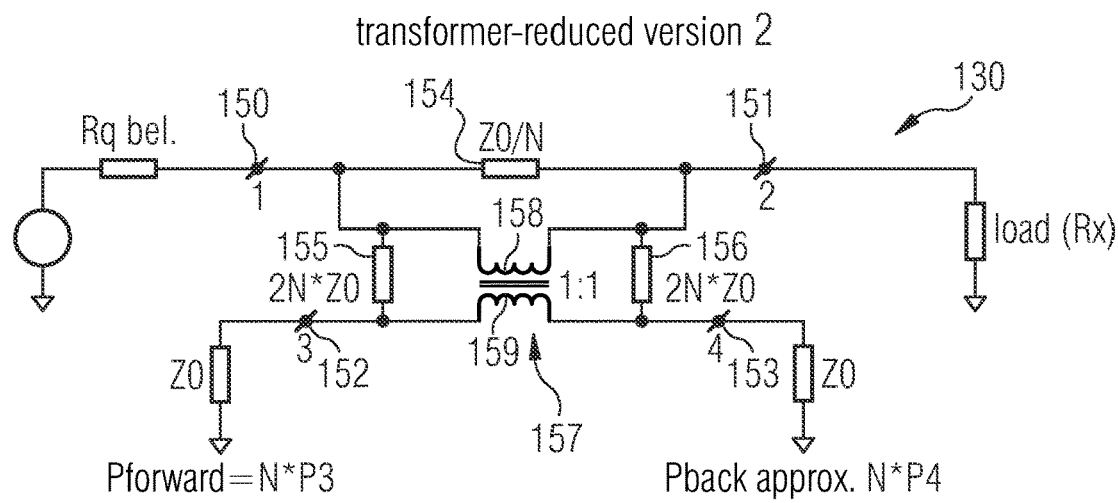
FIG. 10c is a schematic block diagram of a directional coupler, according to a further embodiment of the present invention.

FIG. 10c shows a schematic block diagram of a directional coupler 130, according to an embodiment of the present invention. The directional coupler 130 includes a first terminal 150, a second terminal 151, a third terminal 152, and a fourth terminal 153. Further, the directional coupler 130 includes a first resistor 154 (e.g., of size Z0/N) connected between the first terminal 150 and the second terminal 151, a second resistor 155 (e.g., of size 2N*Z0) connected between the first terminal 150 and the third terminal 152, and a third resistor 156 (e.g., of size 2N*Z0) connected between the second terminal 151 and the fourth terminal 153. Further, the directional coupler 130 includes a transformer 157, wherein a first coil 158 of the transformer 157 is connected between the first terminal 150 and the second terminal 151, and wherein a second coil 159 of the transformer 157 is connected between the third terminal 152 and the fourth terminal 153. The first coil 158 and the second coil 159 can have the same number of windings.

The directional coupler 130 shown in FIG. 10b results from the directional coupler shown in FIG. 10a by combining the two tightly coupled transformers 157_1 and 157_2 of FIG. 10a into one, and shifting the resistor 155 of magnitude N·Z_0 located in the center equally to either side of the remaining transformer 157 in FIG. 10b, resulting in two resistors 155 and 156 of value 2N·Z_0. Since resistors are not significant in terms of cost or volume compared to transformers, this minimal additional cost is irrelevant. In fact, the shift of the internal resistance can also be performed unequally, as long as the value of an imaginary parallel connection of these two resistors results in the value N·Z_0. Thus, in the limiting case, even only one resistor with the value N·Z_0 would suffice, which would be placed on the left or right side of the transformer 157 of FIG. 10b. However, real transformers never have 100% coupling factor, so that the strictly symmetrical version of FIG. 10b also results in a directional coupler behavior that is as symmetrical as possible (i.e. the two outputs for forward and reverse power then also have the same characteristics as far as possible for forward or reverse power supply).

Figure 11A:
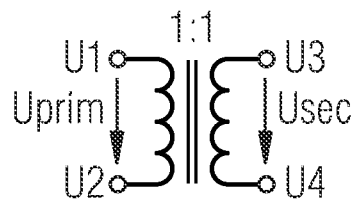
FIG. 11a is a schematic block diagram of a transformer according to a first arrangement.

FIG. 10c shows a variation of the directional coupler 130 shown in FIG. 10b, where the transformer 157 is arranged rotated by 90°. It can be shown that this is possible for ideal transformers with a transmission ratio of 1:1, as long as galvanic isolation does not play a role. For proof, see FIGS. 11a and 11b.

Let a tightly coupled (k=100%) transformer with a transformation ratio of 1:1 and infinitely high main inductance (ideal transformer) be given. Let it be integrated in a network as in FIG. 11a, where the voltages referenced to mass $U_1$, $U_2$ and $U_3$ can be present at three nodes. The voltage $U_4$ is now no longer freely selectable, because due to the switching constraints $U_{prim}=U_{sek}$, the same is subject to the condition $$U_4=U_3-U_{sek}=U_3-(U_1-U_2)=U_2+U_3-U_1$$

Figure 11B:
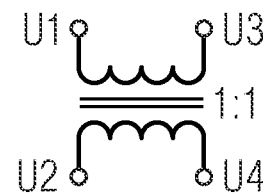
FIG. 11b is a schematic block diagram of a transformer according to a second arrangement.

If galvanic isolation is not needed (and only then!), the transformer can also be rotated by 90°, as shown in FIG. 11b. Here, too, the potentials $U_1$, $U_2$ and $U_3$ are predetermined by the netword in the same way. Now let $U_{prim}=U_1-U_3$. Because of $U_{prim}=U_{sek}=U_2-U_4$, $U_4$ is to hold:

$$U_4=-U_{prim}+U_2=U_2-(U_1-U_3)=U_2+U_3-U_1$$

Thus, the fourth voltage determined by switching constraint results in the same value in both cases, so the networks are equivalent. qed.

However, since real transformers are non-ideal, i.e. the main inductance is not infinitely large, the leakage inductance is not zero and the coupling factor is less than 100%, the version shown in FIG. 10b or FIG. 10c can provide better results, depending on the transformer available and the intended frequency range.

In embodiments, an evaluation of the phase position of the signal 124 (e.g., advancing power) advancing into the magnetic loop 108 is performed, for example, by means of a comparison between the phase position of the signal 124 (e.g., advancing power) advancing into the magnetic loop 108 with the power inductively coupled out from the loop 108, for example, via a small coupling loop 128.

Since the tuning direction is known by this method of phase evaluation (in the method in the next section, the direction in which tuning is needed is not known), very fast tracking of the resonance is possible, thus tuning per hop is possible for frequency hopping systems, magnetic antennas can thus be used for frequency hopping systems or for telegram splitting systems [6] and [7].

Embodiments provide a directional coupler version with a reduced number of transformers.

Figure 12:
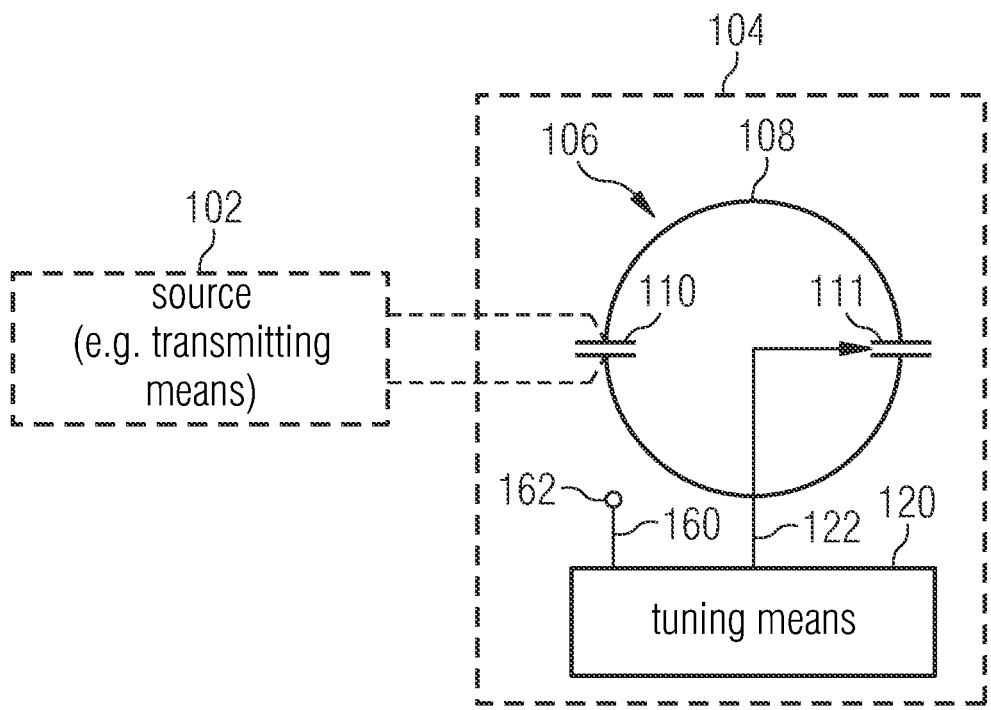
FIG. 12 is a schematic block diagram of an antenna arrangement, according to an embodiment of the present invention.

2.2. Generation of Tuning Information/Matching Information by Amplitude Evaluation During Self-Reception FIG. 12 shows a schematic block diagram of an antenna arrangement 104 according to an embodiment of the present invention. The antenna arrangement 104 includes the magnetic antenna 106 with the tuning element 111, and the tuning means 120 for tuning the magnetic antenna 106.

The tuning means 120 is configured to provide the tuning signal 122 (e.g., tuning voltage) for tuning the magnetic antenna 106 in dependence on an amplitude of a signal 160 based on a magnetic field (e.g., in the near field) generated by the loop 108 or by the magnetic antenna 106, and to control the tuning element 111 with the tuning signal 122 to tune the magnetic antenna 106.

In embodiments, the antenna arrangement 104 can comprise an induction loop 162 (or induction coil) configured to provide the signal 160 based on the magnetic field generated by the loop. The loop 108 of the magnetic antenna 106 and the induction loop 162 (or induction coil) can be disposed (e.g., implemented) on the same circuit board.

In embodiments, the tuning means 120 can be configured to control the tuning element 111 with the tuning signal 122 such that to regulate the amplitude of the signal 160 to a predetermined set value, for example such that the amplitude is greater than or equal to the predetermined (e.g., predefined) set value (e.g., reference value).

For example, the tuning means 120 can be configured to regulate the amplitude of the signal based on the magnetic field generated by the loop to the predetermined set value by controlling the tuning element 111 with the tuning signal 122 (e.g., control signal).

For example, the tuning means 120 can be configured to track the tuning signal 122 (e.g., control signal) to counteract a deviation of the amplitude of the signal based on the magnetic field generated by the loop from the predetermined set value.

The predetermined set value can be determined in advance (e.g., in a factory calibration) by a reference measurement in the undisturbed case of the magnetic antenna 106 and/or in the resonance case of the magnetic antenna 106.

Further or alternatively, the tuning means can be configured to determine the predetermined set value by a reference measurement in the undisturbed case of the magnetic antenna 106 and/or in the resonance case of the magnetic antenna 106.

During reference measurement, a predetermined signal can be emitted using the magnetic antenna 106. For example, the predetermined signal can comprise a predetermined waveform, predetermined transmitting frequency, predetermined bandwidth, predetermined amplitude, and/or predetermined modulation type. For example, the predetermined signal can be a sinusoidal signal having a normalized transmitting voltage.

In the case of magnetic receiving antennas, tuning (resonance frequency) or matching power matching) is usually performed to maximum receiving levels. In the case of magnetic transmitting antennas, tuning to maximum radiation power is performed. The tuning information or matching information can be obtained, as will be described in detail below in sections 2.2.1. and 2.2.2., whereby the tuning or matching of the magnetic antenna 106 can also be automatically tracked in embodiments.

In the following, a detailed embodiment for determining a regulating variable by self-reception is described for a magnetic transmitting antenna.

2.2.1. Self-Reception

In embodiments, in order to obtain a measured quantity that provides an indication of the matching of the magnetic antenna 106, a small induction loop 162 or a small SMD coil 162 can be placed on the printed circuit board adjacent to the actual magnetic antenna 106. For the case that the magnetic antenna 106 is well matched, a voltage of a certain amplitude is induced in this loop 162. Subsequently, if the magnetic antenna 106 no longer resonates and is matched at the needed frequency by a nearby body, the amplitude of the induced voltage decreases. This voltage difference can subsequently be detected accordingly. After tapping and rectification, an analog control variable can be obtained therefrom, for example, or a corresponding digital control can be constructed by A/D conversion.

If different materials are placed in the vicinity of the magnetic antenna 106, the influence of the materials on the antenna properties can be evaluated qualitatively on the basis of the induced measurement voltage. A value determined in the undisturbed case with normalized transmission voltage serves as a reference. This reference measurement can also be repeated in the case of use by emitting a sine tone at one or several frequencies through the magnetic transmitting antenna 106 and receiving the same at the induction loop 162. This allows re-measurement and verification of the resonance curve of the installed magnetic antenna 106 at the location of application. If the obtained induction loop 162 is compared, for example after rectification and A/D conversion, for example in a microcontroller, with corresponding tables or reference values, strategies for optimizing the antenna characteristics (retuning, matching) can be implemented specifically for the current application situation.

Thus, in embodiments, a tuning signal (e.g., of tuning information or matching information) is generated by self-reception.

In embodiments, for this purpose, a small induction loop 162 or a small SMD coil 160 can be placed on the same printed circuit board (PCB) as the magnetic transmitting antenna 106.

In embodiments, an indication of tuning or matching can be generated from the receiving power of the inductive loop 162 or SMD coil 162, for example by comparison with stored calibration information.

2.2.2. Tuning Direction or Matching Direction by Transmitting on Several Frequencies Section 2.2.1. showed how the degree of current tuning or adaptation can be measured.

However, after one or several variables have been detected once, it cannot be clearly determined in which direction the (magnetic) antenna 106 is out of tune or incorrectly matched.

That is, whether it is currently tuned for a frequency that is too high or too low, or is too inductively or capacitively matched. Normally, a calibration step would involve transmitting more frequently, measuring each time, and changing the matching of the magnetic antenna 106 until a set value or set value range (e.g. optimum) is reached.

This problem can be solved by transmitting on different frequencies and detecting one or several measured quantities. Using this information, a measured curve can be generated that represents matching across the frequency (or the best point is selected).

In embodiments, emitting a "calibration tone" or transmitting signal can be performed at multiple frequencies.

In embodiments, a self-receiving power can be measured at multiple frequencies.

In embodiments, the "tuning direction or matching direction" can be generated by evaluating the course of the receiving power at the different frequencies.

2.3. Tuning by Measuring the Power or Current Consumption of the Transmitting Means (Transmitting ICs)

An antenna 106 is best tuned when no power is reflected ($P_{reflect}$), or the ratio of the power ($P_{out}$) transmitted into the antenna 106 to the reflected power (P reflect) reflect) becomes maximum. Matching refers to both matching to a desired impedance and tuning to a desired transmitting frequency. The impedance can be changed by a matching network. This changes the matched frequency of the antenna and the efficiency of the amplifier. With magnetic antennas, the receive frequency and the matching are equally detuned. This can be done, for example, by switching capacitors. For electric antennas, the electrical length and thus the frequency can be detuned, e.g. by switches. This chapter describes how a tuning signal for reducing the reflected power can be determined.

2.3.1. Measurement Setup

Figure 13:
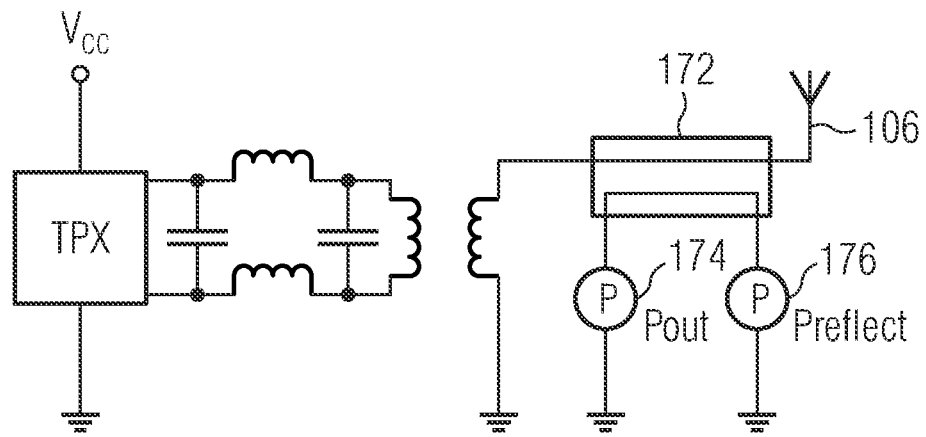
FIG. 13 is a schematic block diagram of a measurement setup for determining an output power and a reflected power of an antenna.

For example, a directional coupler 172 and two power meters 174 and 176 can be used to determine the power going into or out of the antenna 170, as shown in FIG. 13.

Figure 14:
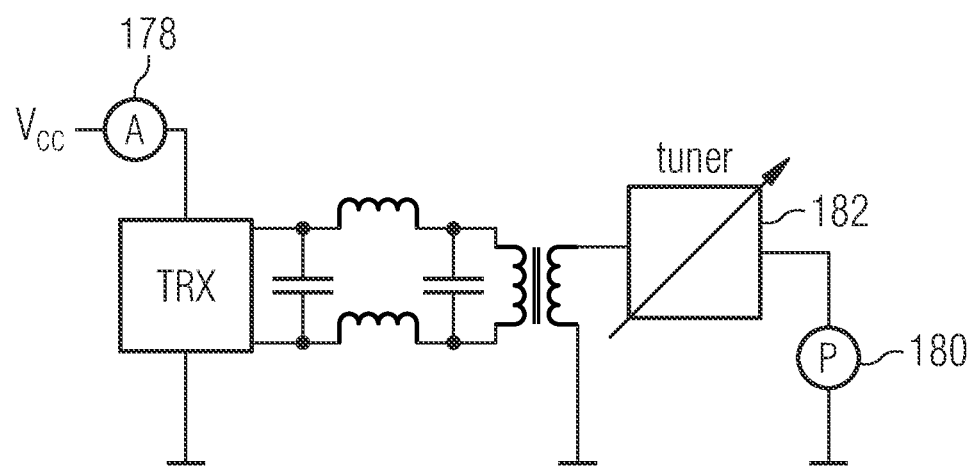
FIG. 14 is a schematic block diagram of a measurement setup for determining an ideal antenna match.

Using the measurement setup shown in FIG. 14, it has been shown that in typical transmitting means 102 (e.g., transmitter circuits), such as those used for wireless sensor nodes, the input current changes depending on the antenna matching. The measurement setup includes an ampere meter 178 that measures the input current of the transmitting means 102 (e.g., transmitter circuit), a powermeter 180 that measures the output power, and a coaxial tuner 182.

With the coaxial tuner 182, all desired impedances can be simulated for the needed frequency. To accomplish this, the tuner 182 can be calibrated using a Vector Network Analyzer (VNA), for example, and then connected to the device under test.

Using the measurement setup shown in FIG. 14, the current consumed by the transmitting means 102 (e.g., transmitting system) and the output transmitting power can be determined for all set complex impedances. As shown in FIG. 14, the transmitting means 102 (e.g., front end) can now be measured and the course between output power and input current can be exposed.

Figure 15:
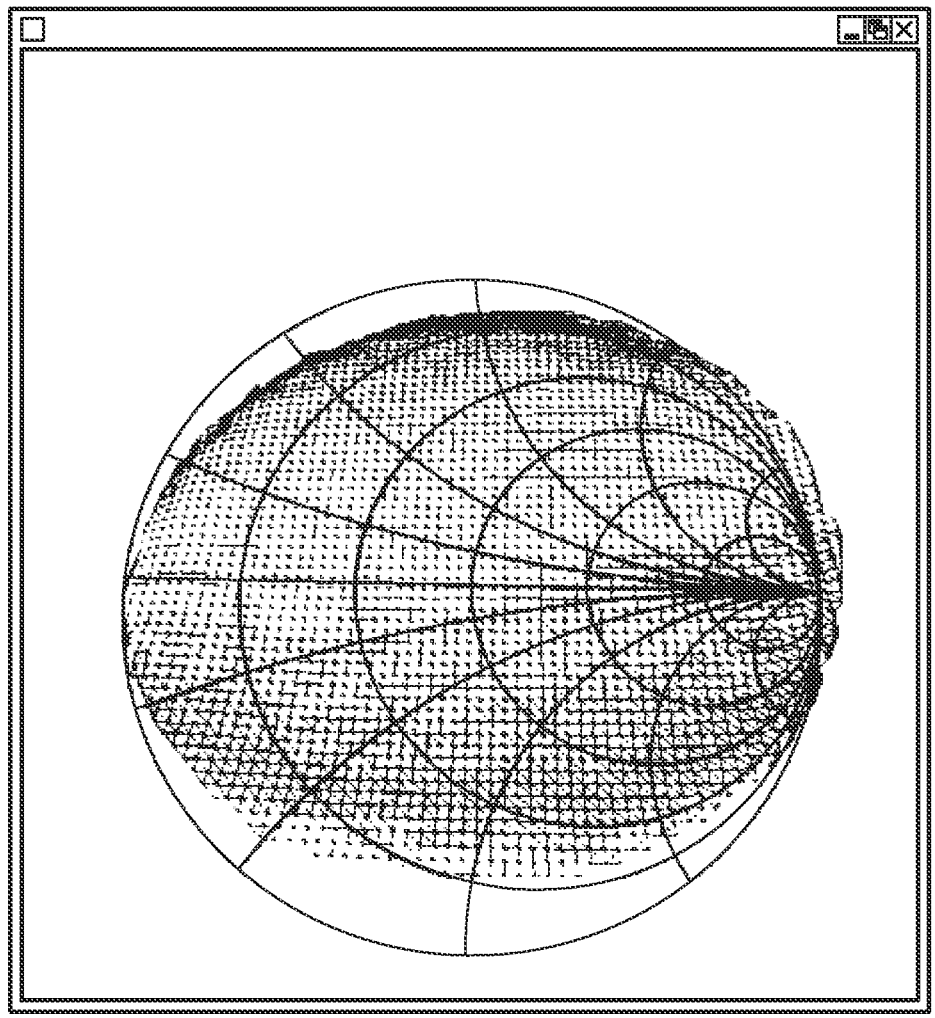
FIG. 15 shows, in a Smith chart, the current consumption of the transmitting means plotted against the antenna impedance.
Figure 16:
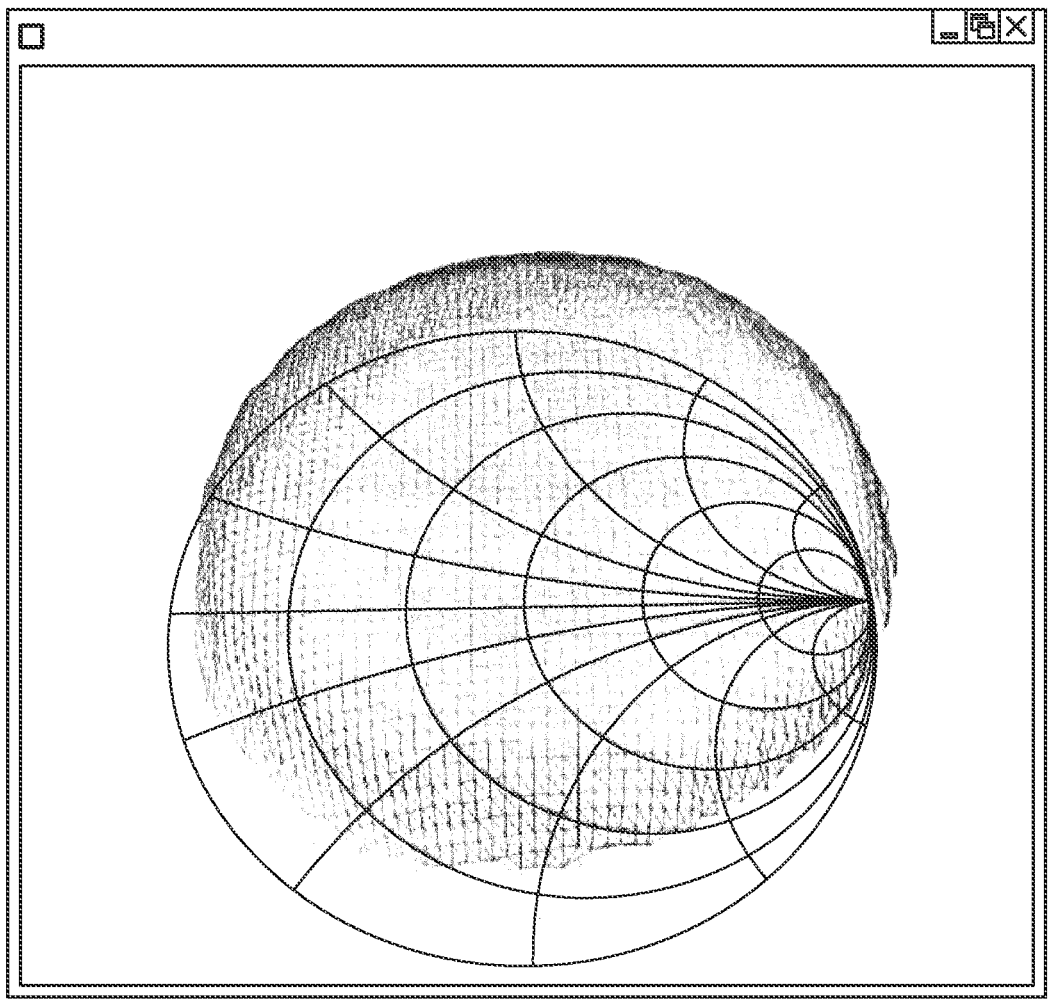
FIG. 16 shows, in a Smith chart, the output power plotted against the antenna impedance.

From this, two 3D graphs can be generated showing the input current and output power versus the antenna impedance, as shown in FIG. 15 and FIG. 16.

In detail, FIG. 15 shows the current consumption of the transmitting means 102 plotted against the antenna impedance in a Smith chart. The lower area of the Smith chart shows a higher current consumption, while the upper area of the Smith chart shows a lower current consumption. In the center of the Smith chart at 50 ohms, the transmitting means 102 consumes approximately 100 mA.

FIG. 16 shows the output power plotted against the antenna impedance in a Smith chart. The center area of the Smith chart shows an output power of approx. 18 dBm, wherein the power decreases towards the edge of the Smith chart.

Figure 17A:
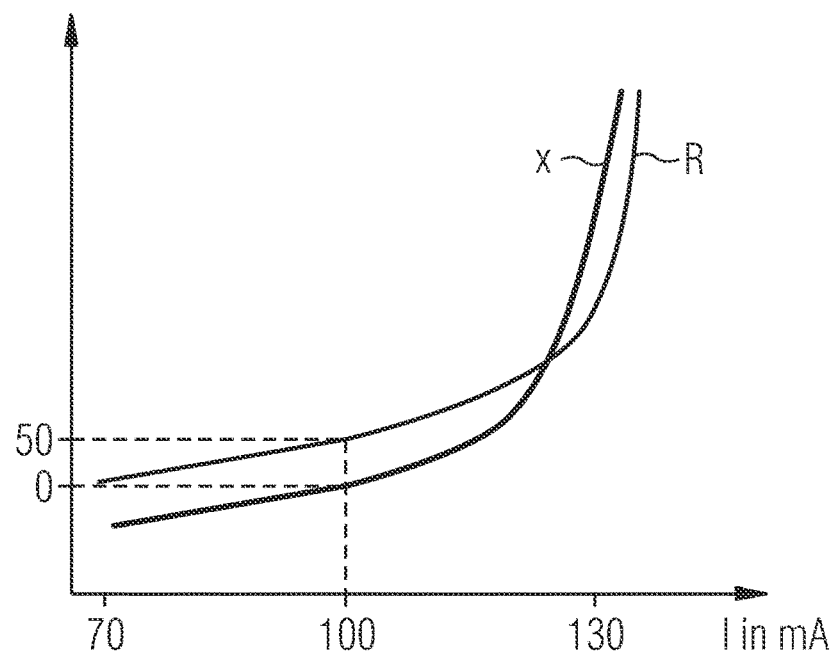
FIG. 17a shows, in a diagram, a course of a real part R and an imaginary part X of the antenna impedance plotted against the input current.
Figure 17B:
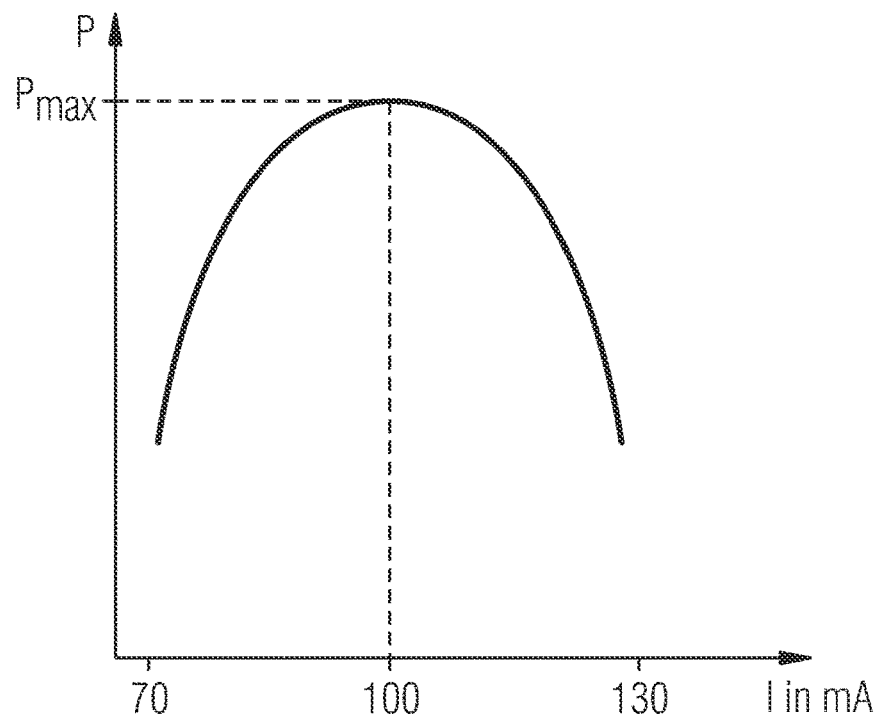
FIG. 17b shows, in a diagram, a course of the output power plotted against the input current.
Figure 18:
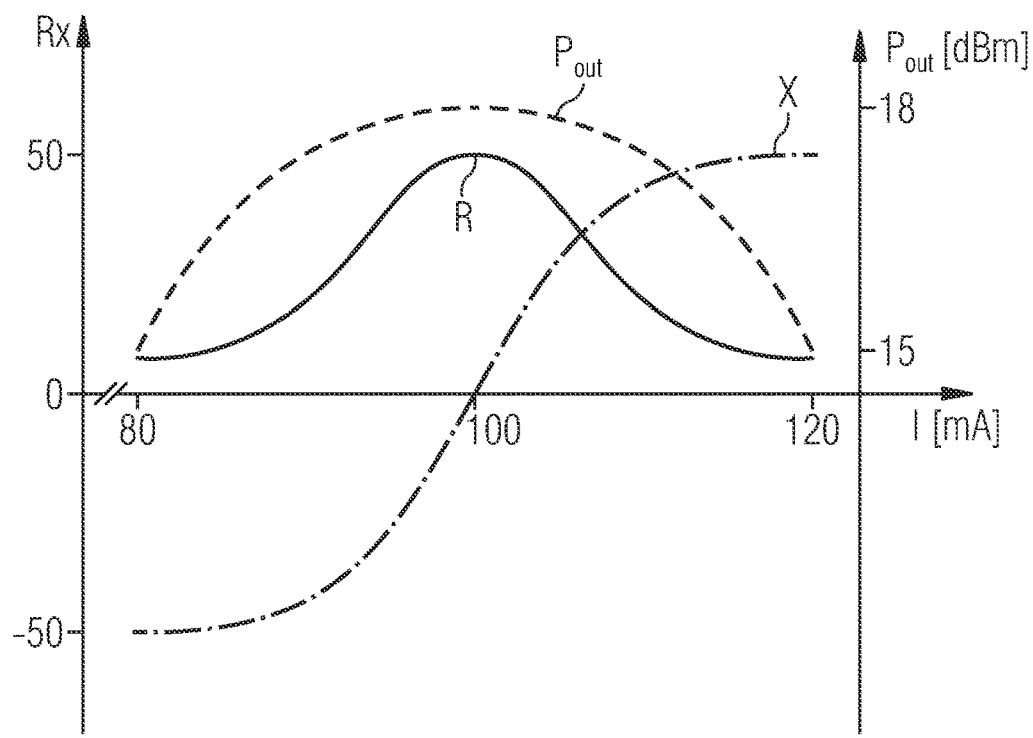
FIG. 18 shows, in a diagram, a course of a real part R and an imaginary part X of the antenna impedance as well as a course of the output power plotted against the input current.

If the impedance and power course is now plotted schematically against the input current (of the transmitting means 102), courses as shown in FIG. 17a, FIG. 17b and FIG. 18 result.

In detail, FIG. 17a shows in a diagram a course of a real part R and an imaginary part X of the antenna impedance plotted against the input current of the transmitting means 102. Here, the ordinate describes the impedance in ohms and the abscissa describes the input current of the transmitting means 102 in mA.

FIG. 17b shows in a diagram a course of the output power plotted against the input current of the transmitting means 102. Here, the ordinate describes the power and the abscissa describes the input current of the transmitting means 102 in mA.

FIG. 18 shows in a diagram a course of a real part R and an imaginary part X of the antenna impedance as well as a course of the output power plotted against the input current of the transmitting means 102. In FIG. 18, the ordinate describes the impedance in ohms and the power in dBm, respectively, and the abscissa describes the input current of the transmitting means 102 in mA.

It follows that the imaginary part X is strictly monotonically increasing with the input current (of the transmitting means 102). From the measurement points "short circuit" to "open", as illustrated in FIG. 17a, the input current (of the transmitting means 102) increases continuously. The course of output power versus input current shows that an input current of about 100 mA corresponds to the maximum output power (Pout versus Iin). This is (50+0j) ohms at the measurement point.

Tus, the measurement setup shows that it is possible to make a statement about the quality of the antenna matching by measuring the input current (of the transmitting means 102).

Figure 19:
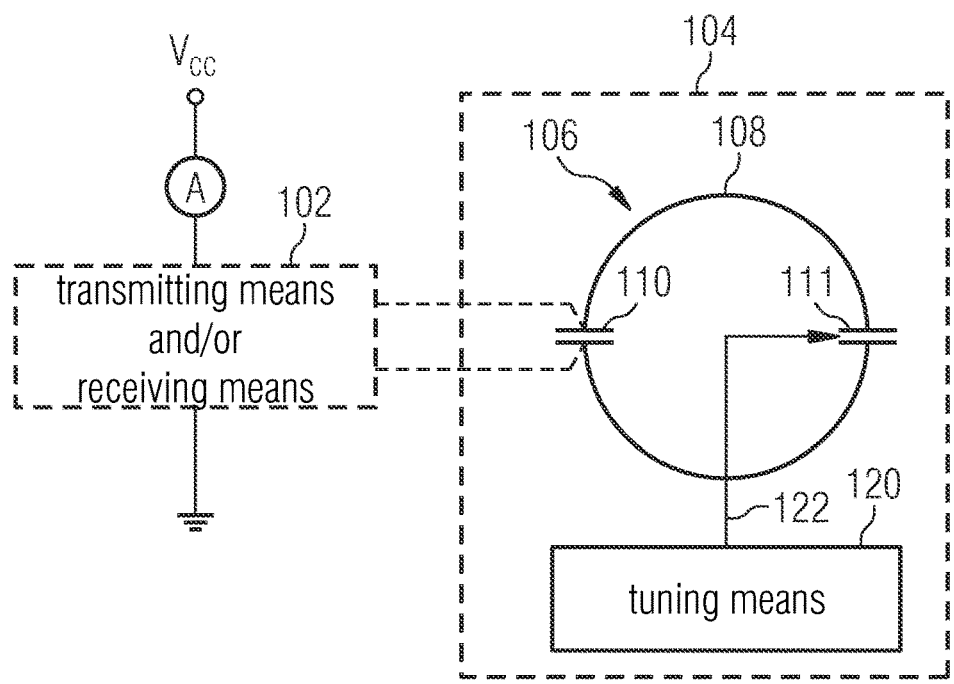
FIG. 19 is a schematic block diagram of an antenna arrangement, according to an embodiment of the present invention.

2.3.2. Generation of the Tuning Signal in Dependence on a Power or Current Consumption of the Transmitting Means FIG. 19 shows a schematic block diagram of an antenna arrangement 104 according to an embodiment of the present invention. The antenna arrangement 104 includes an antenna 106 having a tuning element 111, and the tuning means 120 for tuning the antenna 106. The tuning means 120 is configured to provide the tuning signal 122 for tuning the antenna 106 in dependence on a power or current consumption of a transmitting means 102 connected to the antenna 106, and to control the tuning element 111 with the tuning signal 122 to tune the antenna 106.

As shown in FIG. 19, in embodiments, the antenna 106 can be a magnetic antenna 106 having a loop 108 interrupted one or several times. However, in embodiments, the antenna 106 can also be an electric antenna.

In the following description, it is assumed by way of example that the antenna 106 is a magnetic antenna. However, it should be noted that the embodiments described below with respect to tuning the antenna in dependence on a power or current consumption of the transmitting means 102 connected to the antenna 106 or on a power or current consumption of an active member of the transmitting means are also applicable to an electric antenna.

In embodiments, the current consumption of the transmitting means can be determined, for example, by means of a current-measuring device 186 (e.g., amperemeter). Instead of the current consumption, the power consumption of the transmitting means 102 can also be determined, for example, by means of a power meter.

In embodiments, the tuning means 102 can be configured to control the tuning element 111 with the tuning signal 122 to regulate the power or current consumption of the transmitting means 102 to a predetermined (e.g., predefined) set value range.

For example, the tuning means 120 can be configured to regulate the power or current consumption of the transmitting means 102 to the predetermined set value range by controlling the tuning element 111 with the tuning signal 122 (e.g., control signal).

For example, the tuning means 120 can be configured to track the tuning signal 122 (e.g., control signal) to counteract a deviation of the power or current consumption of the transmitting means 102 from the predetermined range of values.

The predetermined set value range (e.g. predefined value range) can be determined, for example
- by a system simulation assuming an ideal or near-ideal matching of the magnetic antenna,
- upon termination of the transmitting means 102 with a predefined impedance (e.g., 50 ohms),
- based on an antenna measurement (e.g. by means of an antenna tuner),
- based on an average value of the power or current consumption with the short-circuited terminal and the open terminal of the transmitting means 102,
- based on a measurement of a radiation power.

Figure 20:
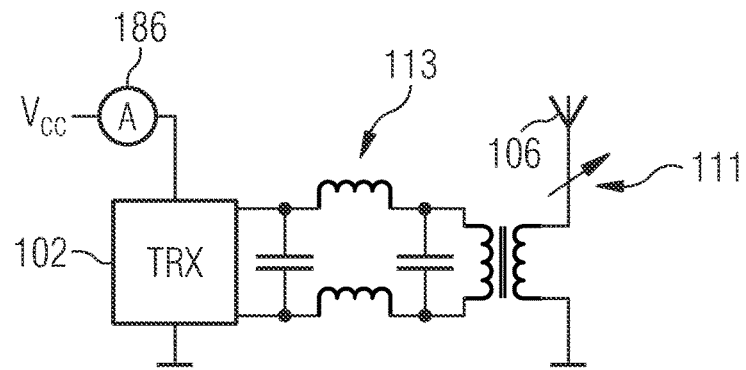
FIG. 20 is a measurement setup for determining the ideal antenna match, according to an embodiment of the present invention.

FIG. 20 shows a measurement setup for determining ideal antenna matching according to an embodiment of the present invention. The measurement setup includes a transmitting means 102, a magnetic antenna 106 having the tuning element 111, a matching network 113 between the transmitting means 102 and the magnetic antenna 106, and an ampere meter 186 for measuring the current consumption of the transmitting means 102, wherein the tuning signal 122 for tuning the magnetic antenna 106 is generated in dependence on the measured current consumption of the transmitting means 102. The measurement setup shown in FIG. 20 can be implemented, for example, in a device such as a participant 100 of a communication system.

As can be seen in FIG. 20, the device can now be greatly simplified in contrast to the setup of FIG. 13 because in embodiments only one amperemeter 186 is needed instead of a directional coupler 172 and two power meters 174 and 176. The current measurement can be used for tuning the transmitting antenna 106.

Calibration of the setup can include the following steps:
1. determining the ideal current value, and
2. adjusting the (magnetic) antenna 106.

In the next step, the (magnetic) antenna 106 can be matched based on the calibrated current values. During operation, antenna matching can be changed until the desired current (input current of the transmitting means) is reached. Due to the monotonically increasing impedance curve, the direction in which the optimum lies is directly known after adjusting the (magnetic) antenna 106 once. The adjustment is also possible during operation. Either a CW signal (CW=continuous wave, i.e. an unattenuated, i.e. temporally constant radiated wave) or the modulated signal, e.g. G-MSK (Gaussian Minimum Shift Keying), can be used directly as the transmitting signal.

Adjustment of the (magnetic) antenna 106 is possible by means of a test signal (CW), wherein the useful signal is transmitted only under optimized conditions, for example. By optimizing the antenna matching, the system is operated in an optimal efficiency. This can reduce the energy consumption.

The matching network used can have, for example, N states that can be directly associated with corresponding current values. Thus, matching of the (magnetic) antenna 106 is possible via a few steps through a table. This minimizes the programming effort.

By changing the phase of the transmitting signal, the (magnetic) antenna 106 can be additionally matched.

If matching is not possible, the system (e.g., the participant 100 or the tuning means 120 of the participant 100) can interrupt the transmitting process and check the matching again at a later time. This can save energy since the participant (e.g., node) is transmitting at optimum efficiency.

Embodiments have the advantage of saving hardware costs since no an RF coupler and power meter are needed.

Embodiments have the advantage that there is no attenuation of the output power by the RF coupler.

Embodiments have the advantage that an increasing current indicates the direction of the matching. No minimum search is needed, which means that the ideal value can be found more quickly.

Embodiments have the advantage that, in the case of a digital or software-based implementation, it can be easily programmed using an assignment table.

Embodiments have the advantage of being applicable to various transmitting systems.

Embodiments have the advantage of energy efficiency.

In embodiments, the device (e.g., the participant 100 or the tuning means 120 of the participant 100) can determine (e.g., measure) the current consumption of the transmitting means 102 (e.g., transmitting IC or transmitting system).

In embodiments, the device (e.g., participant 100) can comprise a tunable (magnetic) antenna 106.

In embodiments, the device (e.g., the participant 100 or the tuning means 120 of the participant 100) can detune the (magnetic) antenna 106 possibly special case "short circuit" and "open", 50Ω).

In embodiments, the device (e.g., the participant 100 or the tuning means 120 of the participant 100) can use the current information to find an ideal antenna setting (see procedure above).

In embodiments, the device (e.g., the participant 100 or the tuning means 120 of participant 100) can tune the variable (e.g., tunable) (magnetic) antenna 106 by measuring the current consumption of the transmitting means 102 (e.g., transmitting IC).

In embodiments, the device (e.g., the participant 100 or the tuning means 120 of the participant 100) can detect a deviation from matching by deviations in current consumption at ideal matching (50Ω).

2.3.3. Characterization of the System

In order to make a statement about the antenna matching from the measured input current value (of the transmitting means 102), the system (e.g., the participant 100 or the tuning means 120 of the participant 100) can be provided with information about the current consumption at ideal matching.

The input current (of the transmitting means 102) can be determined in various ways. Each method can basically be performed at any stage.

2.3.3.1 Simulation of the System

In embodiments, the input current (of the transmitting means 102) at ideal matching (of the magnetic antenna 106) can be determined using a system simulation, for example in ADS. If sufficiently good models are available, the simulation can provide a dependence of the current consumption on the matching of the (magnetic) antenna 106.

2.3.3.2 Measurements at Ideal Impedance Termination

In embodiments, the desired input current (of the transmitting means 102) with maximum output power can be made, for example, during start-up by storing the current value at a 50 ohm terminated output.

2.3.3.3. Single Measurement with Tuner, e.g. in Laboratory

In embodiments, using a setup such as that shown in FIG. 14, an antenna tuner 182 can be used to measure each point and find the maximum power.

2.3.3.4. Measurement on any Hardware, e.g. Test at Start-Up During Production In embodiments, the ideal point can also be achieved by connecting (e.g., screwing on) different calibration standards. For example, a 50 ohm termination can be used which directly indicates the ideal current.

A termination (e.g. connector) with "open" end or "short circuit" can also be used to determine the direction of the impedance course. The ideal current can be taken as the average value between the two (e.g. "open" and "short circuit").

All of the three calibration standards ("open", "short circuit", "50 ohms") can be used together or individually to obtain information about the current course.

Other standards deviating from 50Ω can also be used if the ideal impedance for maximum power deviates therefrom.

2.3.3.5 Calibration of the Current Consumption by Reception with a Reference Antenna In embodiments, a radio link can be set up for calibration, wherein the signal emitted by the transmitter with a (magnetic) antenna 106 can be received by another antenna and the receiving power can be evaluated. Here, the tuning elements 111 of the (magnetic) antenna 106 can be manually changed and the corresponding receiving power and current consumption can be noted. The current consumption at maximum receiving power is the value to which tuning is performed during operation. For improved reproducibility, the measurement can be performed in a shielded and anechoic environment, such as an antenna measurement hall.

2.3.3.6. Measurement with on Board Circuit e.g. in the Field

In embodiments, external calibration connectors can also be implemented directly on the circuit board and switched, for example, via an RF switch. In this way, it is possible to determine the ideal current even under different operating modes or environmental conditions, such as temperature (cold, heat).

2.3.3.7. Previous Knowledge of the Course of the Impedance of the Antenna

In embodiments, by having previous knowledge of the impedance behavior when the used (magnetic) antenna 106 is detuned, a statement can be made about the ideal current consumption of the transmitting means 102 (e.g., transmitting system) for the respective course of the impedance. A function can be determined, which can give the ideal point between the cases "short circuit" and "open" for the used (magnetic) antenna 106. This is only needed if the course deviates from a straight line (case: center between "short circuit" and "open" is ideal).

2.3.3.8. Feedback of the Emitted Power from Another Participant

In embodiments, during normal operation (e.g., in the field), the emitted signal can be received by another participant, which can report back to the transmitting participant how good the received signal was, thereby allowing the transmitting participant to generate a tuning voltage.

2.3.4. Advantages and Embodiments

Embodiments have the advantage that calibration of the device (e.g., participant 100 or magnetic antenna 106) can be performed in operation ("short-circuit", "open", 50 ohms).

Embodiments have the advantage that the device (e.g., the participant 100 or the tuning means 120 of the participant 100) can include matching information through previous calibration.

Embodiments have the advantage that the device (e.g., the participant 100 or the tuning means 120 of the participant 100) can perform calibration with fewer standards (e.g., only "short-circuit" and "open"), where the center can be assumed to be ideal.

Embodiments have the advantage that the device (e.g., the participant 100 or the tuning means 120 of the participant 100) can simplify/optimize the calibration by known antenna behavior.

In embodiments, the device (e.g., the participant 100 or the tuning means 120 of the participant 100) can measure the current consumption of the transmitting means (e.g., transmitting IC or transmitting system).

In embodiments, the device (e.g., participant 100) can comprise a tunable (magnetic) antenna 106.

In embodiments, the device (e.g., the participant 100 or the tuning means 120 of the participant 100) can detune the (magnetic) antenna 106 possibly special case Short-circuit and Open, 50Ω).

In embodiments, the device (e.g., the participant 100 or the tuning means 120 of the participant 100) can use the current information to find ideal antenna settings (see procedure above).

In embodiments, the device (e.g., the participant 100 or the tuning means 120 of the participant 100) can tune the variable (e.g., tunable) (magnetic) antenna 106 by measuring the current consumption of the transmitting means 102 (e.g., transmitting IC).

In embodiments, the device (e.g., the participant 100 or the tuning means 120 of the participant 100) can include the matching information through previous calibration.

In embodiments, the device (e.g., the participant 100 or the tuning means 120 of the participant 100) can perform calibration in operation ("Short", "Open, "50 ohms").

In embodiments, the device (e.g., the participant 100 or the tuning means 120 of the participant 100) can detect a deviation from matching by deviations in current consumption at ideal matching (50Ω).

In embodiments, the device (e.g., the participant 100 or the tuning means 120 of the participant 100) can perform a calibration, for example, in operation with fewer standards (e.g., only "short-circuit" and "open"), where the center can be assumed to be ideal.

In embodiments, the device (e.g., the participant 100 or the tuning means 120 of the participant 100) can perform calibration in operation, for example, with 50 ohms as a reference for ideal matching of the antenna 106.

In embodiments, the device (e.g., the participant 100 or the tuning means 120 of the participant 100) can use adaptation information (current consumption) to find an optimal transmitting time.

For example, transmission cannot take place until the optimal efficiency is reached.

In embodiments, the device (e.g., the participant 100 or the tuning means 120 of the participant 100) can use antenna matching to save energy.

In embodiments, the device (e.g., the participant 100 or the tuning means 120 of the participant 100) can use a phase adjustment to change the antenna matching.

In embodiments, the device (e.g., the participant 100) can receive feedback about the emitted signal from another participant in the radio network.

2.4. Current Consumption/Other Effects of an Output Stage

Section 2.3 described the tuning (of the magnetic antenna 106) by measuring the current consumption of the transmitting means 102 (e.g., transmitting IC). The transmitting means 102 typically includes a power amplifier that provides the transmitting power needed for radiation with an antenna 106.

The power amplifier is generally made up of several active as well as passive electronic components. The same can be used to detect electrical measured quantities which allow conclusions to be drawn about the antenna matching and can thus be used to generate the tuning signal 122 (e.g. tuning voltage).

2.4.1. Measuring the Supply Current of the Active Devices

Measuring the supply current of the active device(s) (e.g., power transistors) of the power amplifier (the transmitting means 102) is equivalent to measuring the current consumption of the transmitting means (e.g., transmitting IC) and allows for more precise detection of matching information. Other consumers in the transmitting means 102 (e.g., transmitting IC) do not interfere with the measurement.

In the case of two or more active devices, a statement about the matching can be made via the difference of the supply currents. Examples here would be amplifiers constructed according to the balanced, push-pull and Doherty methods. Push-pull and Doherty amplifiers in particular react sensitively to returning power, which in turn is reflected in a changed operating behavior and thus also in the supply currents.

2.4.2. Measurement of the Bias Current of the Active Devices

Direct measurement of current consumption is more complex at higher powers due to the higher voltages involved (high-level current-sense needed).

Figure 21:
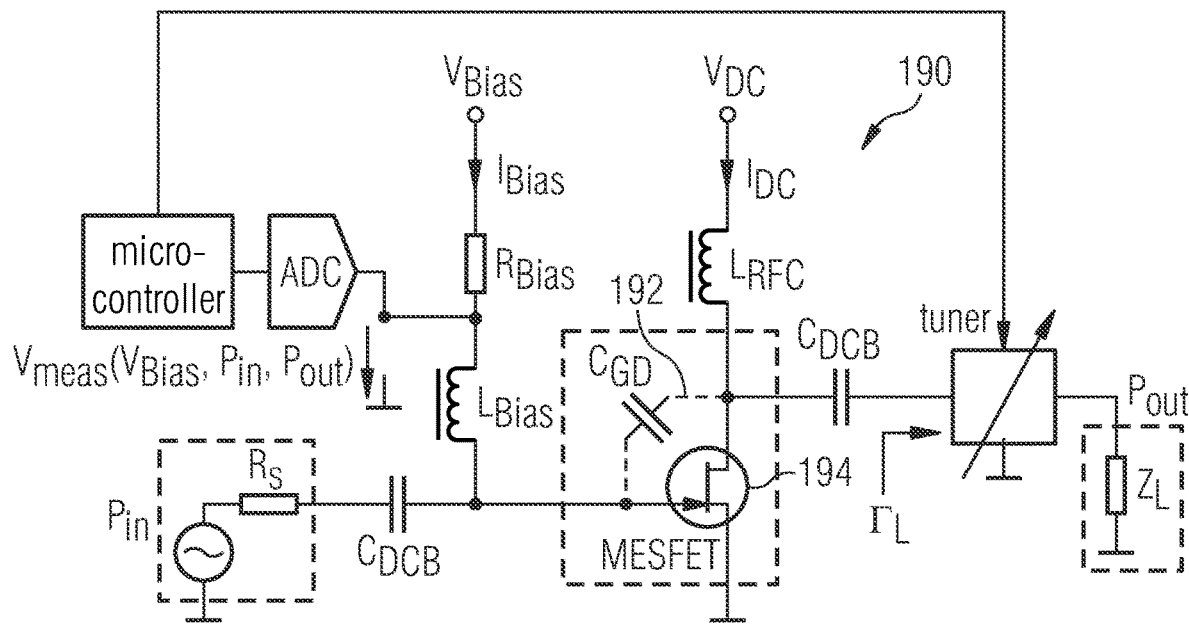
FIG. 21 is a schematic block diagram of a transmitting means with a power amplifier, according to an embodiment of the present invention.

Metal-semiconductor field-effect transistors (MESFET) have a Schottky contact at the gate, which acts as a rectifier at higher RF input powers $P_{in}$, a gate current $I_{Bias}$ flows (see FIG. 21). Via the parasitic gate drain capacitance ($C_{GD}$) 192 (of transistor 194), this rectifying effect is also dependent on the output power $P_{out}$. If there is circuit access to the gate terminal, a voltage $V_{meas}$ can be trapped at the transistor $R_{Bias}$ in dependence on the gate current; this voltage is dependent on the output power $P_{out}$ at a given input power $P_{in}$ and thus the adaptation of the load. It is therefore possible to make a statement about the matching of the load, i.e. the antenna 106 via the measurement voltage $V_{meas}$. $V_{meas}$ can be tapped directly via an analog-to-digital converter and used to control the antenna tuner for tuning, as shown in FIG. 21.

In detail, FIG. 21 shows a schematic block diagram of a transmitting means having a power amplifier 190 according to an embodiment of the present invention. As can be seen in FIG. 21, a tuning voltage for regulating the antenna tuner can be generated based on (e.g., by a) measurement of the bias current I_Bias of the active devices 194.

Figure 23:
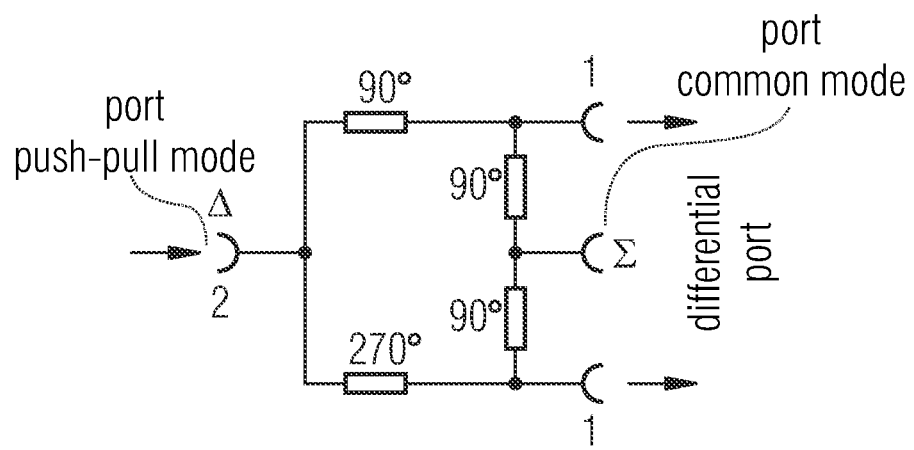
FIG. 23 is a schematic block diagram of a ring coupler providing access to a common mode of a differential port.

2.4.3. Generating a Tuning Voltage by Measuring the Common Mode of the Magnetic Antenna The antenna loop 108 of a magnetic antenna 106 is a differential load. Using a transformer (balun), this two-pole differential load can be controlled by a single-pole source, as shown in FIG. 23.

Figure 22:
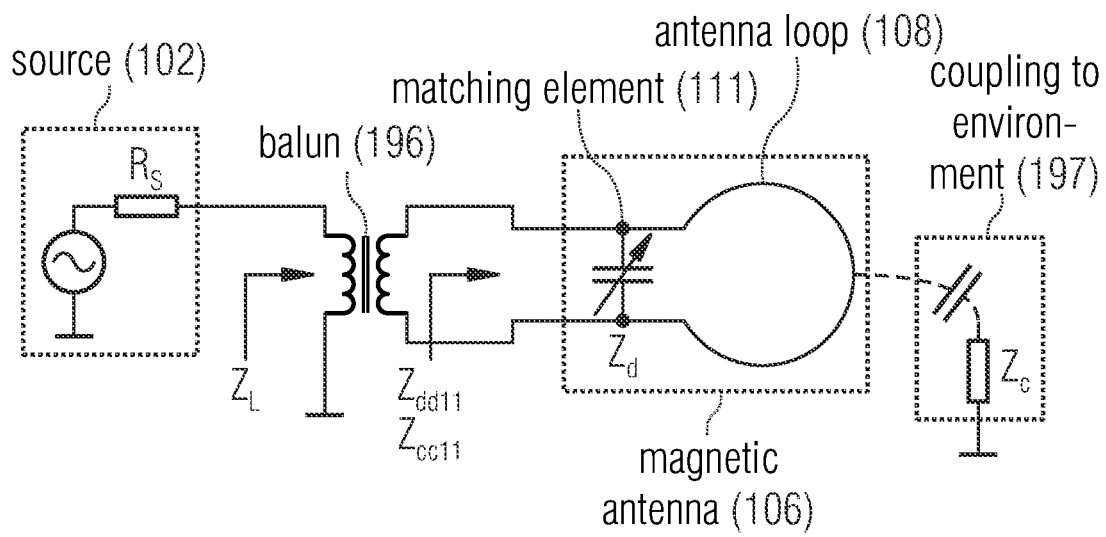
FIG. 22 is a schematic block diagram of an antenna arrangement, according to an embodiment of the present invention.

In detail, FIG. 22 shows a schematic block diagram of an antenna arrangement 104 according to an embodiment of the present invention. The antenna arrangement 104 comprises the magnetic antenna 106 having the loop 108 and the tuning element 111, wherein the magnetic antenna 106 is connected to a source 102, such as a transmitting means, via a transformer 196 (balun). Here, the antenna loop 108 can be differentially controlled such that the common mode Zcc11 before the balun 196 is no longer visible.

As can be seen in FIG. 22, the source 102 "sees" the load impedance $Z_L$.

The magnetic antenna 106 including antenna loop 108 and matching element 111 comprises the differential impedance $Z_d$. Via the environment 197, the magnetic antenna 106 is coupled to the impedance $Z_c$ coupled. This parasitic coupling results in detuning of the (magnetic) antenna 106 and can be compensated by means of the matching element 111.

Thus, two impedances are measurable at the input of the magnetic antenna 106. The push-pull impedance $Z_{dd11}$ describes the push-pull operation (normal operation of the magnetic antenna 106). The common mode impedance $Z_{cc11}$ describes the common mode operation, which is caused by unwanted coupling with the environment. At the input of the balun 196, only the impedance $Z_L$ is measurable.

Generation of a tuning signal (e.g., tuning voltage) 122 for regulating the matching element 111 can be accomplished by accessing the common mode resulting from the common mode impedance $Z_{cc11}$.

If the magnetic antenna 106 is differentially controlled, a push-pull or a common mode signal can be applied to the (magnetic) antenna 106 and a statement about detuning can be made via the current consumption.

The common mode can be measured or fed-in using two methods, which are described below.

2.4.3.1. Measurement and Feeding of the Common Mode Via the Common Mode Branch of the Output Balun Special baluns 196 allow access to the common mode of the differential port. One example is the so-called ring coupler (also rat-race coupler) in FIG. 23. The common mode characteristics of the magnetic antenna can then be determined either via an active measurement using a measurement signal or via the reflected power and a tuning voltage can be derived therefrom.

2.4.3.2. Measurement of the Common Mode Via the Non-Linearity of the Magnetic Core In order to optimize the size of the balun 196, especially at low frequencies, magnetic cores having a relative permeability deviating from vacuum (or air) are used. These magnetic cores show a non-linear behavior.

Figure 24:
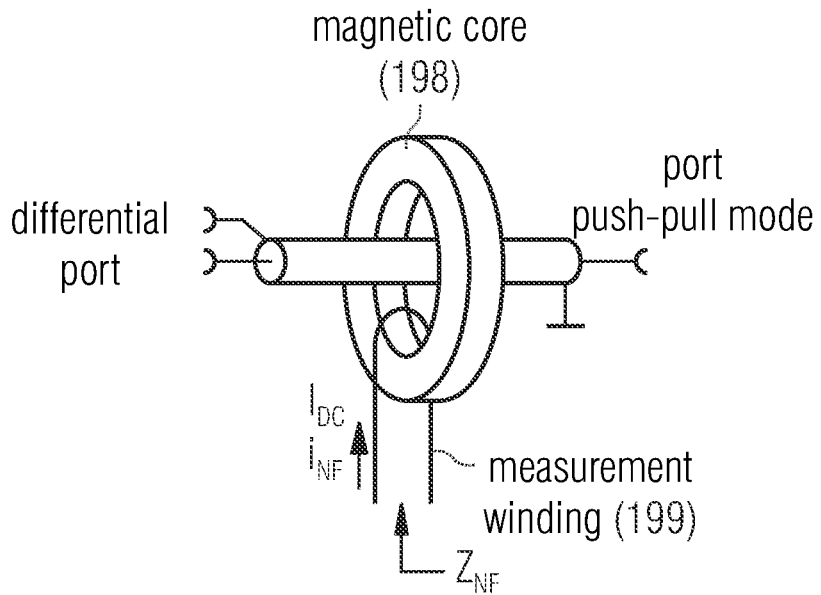
FIG. 24 is a schematic view of a magnetic core of a balun and a measurement winding around the magnetic core for detecting the common mode characteristics of the balun via the non-linear characteristics of the magnetic core with the help of the measurement winding.

With the help of a measurement winding or a Hall sensor, magnetic direct currents, which result from the non-linear behavior of the magnetic core, can be detected, as shown in FIG. 24.

In detail, FIG. 24 shows a schematic view of a magnetic core 198 of a balun 196 and a measurement winding 199 around the magnetic core 198 for detecting the common mode characteristics of the balun via the nonlinear characteristics of the magnetic core 198 with the help of the measurement winding.

2.4.4. Embodiments

In embodiments, the device (e.g., the participant 102 or the tuning means 120 of the participant 100) can measure the current consumption of the power transistor(s) (active devices) (e.g., to generate the tuning signal (e.g., tuning voltage)).

In embodiments, the device (e.g., the participant 102 or the tuning means 120 of the participant 100) can determine the difference in supply currents of two power transistors to generate a tuning voltage.

In embodiments, the device (e.g., the participant 102 or the tuning means 120 of the participant 100) can detect (e.g., measure) a bias current of the power transistor(s) (e.g., the transmitting means 102) to generate a tuning voltage 122.

In embodiments, the device (e.g., the participant 102 or the tuning means 120 of the participant 100) can determine a bias current of the power transistor(s) (e.g., the transmitting means 102) by measuring a voltage across a resistor in the bias branch.

In embodiments, the device (e.g., the participant 102 or the tuning means 120 of the participant 100) can determine a difference in bias currents of two power transistors (e.g., the transmitting means 102) for generating a tuning signal 122 (e.g., tuning voltage).

In embodiments, the device (e.g., the participant 102 or the tuning means 120 of the participant 100) can determine a difference in currents of an amplifier in balanced operation to generate a tuning signal 122 (e.g., tuning voltage).

In embodiments, the device (e.g., the participant 102 or the tuning means 120 of the participant 100) can determine a difference in currents of an amplifier in Doherty operation to generate a tuning signal 122 (e.g., tuning voltage).

In embodiments, the device (e.g., the participant 102 or the tuning means 120 of the participant 100) can determine (e.g., determine) a difference in currents of an amplifier in push-pull operation to generate a tuning signal 122 (e.g., tuning voltage).

In embodiments, the device (e.g., the participant 102 or the tuning means 120 of the participant 100) can determine a common mode impedance of a magnetic antenna 106 for generating a tuning signal (e.g., tuning voltage).

In embodiments, the device (e.g., the participant 102 or the tuning means 120 of the participant 100) can determine a common mode impedance (e.g., of the magnetic antenna 106) with the help of a measurement signal.

In embodiments, the device (e.g., the participant 102 or the tuning means 120 of the participant 100) can alternately feed a push-pull signal and a common mode signal into the magnetic antenna 106 and determine the current consumption and use this information to generate a tuning signal 122 (e.g., tuning voltage).

In embodiments, the device (e.g., the participant 102 or the tuning means 120 of the participant 100) can feed a common mode signal (e.g., into the magnetic antenna 106) with the help of a balun 196 that provides access to the common mode.

In embodiments, the device (e.g., the participant 102 or the tuning means 120 of the participant 100) can determine (e.g., measure) a reflected common mode signal from a magnetic antenna 106 to generate a tuning signal (e.g., tuning voltage).

In embodiments, the device (e.g., the participant 102 or the tuning means 120 of the participant 100) can determine (e.g., measure) a common mode signal (e.g., of the magnetic antenna 106) with the help of a balun that provides access to the common mode.

In embodiments, the device (e.g., the participant 102 or the tuning means 120 of the participant 100) can have access to the common mode (e.g., of the magnetic antenna) with the help of a ring coupler.

In embodiments, the device (e.g., the participant 102 or the tuning means 120 of the participant 100) can have access to the common mode (e.g., of the magnetic antenna) via the nonlinear characteristics of a magnetic core.

In embodiments, the device (e.g., the participant 102 or the tuning means 120 of the participant 100) can use nonlinear characteristics of a magnetic core (e.g., a balun 196) to measure a DC magnetic current with the help of a Hall sensor.

In embodiments, the device (e.g., the participant 102 or the tuning means 120 of the participant 100) can use nonlinear characteristics of a magnetic core (e.g., a balun 196) to measure a DC magnetic current with the help of a measurement winding at the magnetic core.

3. Further Embodiments

Figure 25:
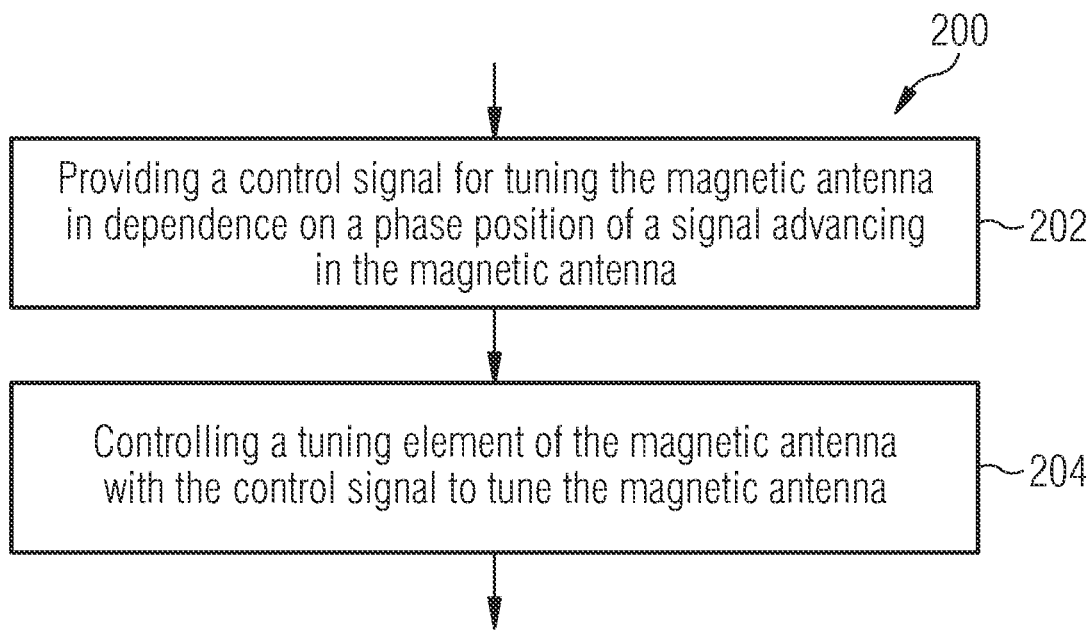
FIG. 25 is a flow diagram of a method for tuning a magnetic antenna having a loop interrupted one or several times, according to an embodiment of the present invention.

FIG. 25 shows a flow diagram of a method 200 for tuning a magnetic antenna having a loop interrupted one or several times, according to an embodiment of the present invention. The method 200 includes a step 202 of providing a control signal for tuning the magnetic antenna in dependence on a phase position of a signal advancing into the magnetic antenna. Further, the method 220 comprises a step 222 of controlling a tuning element of the magnetic antenna with the control signal to tune the magnetic antenna.

Figure 26:
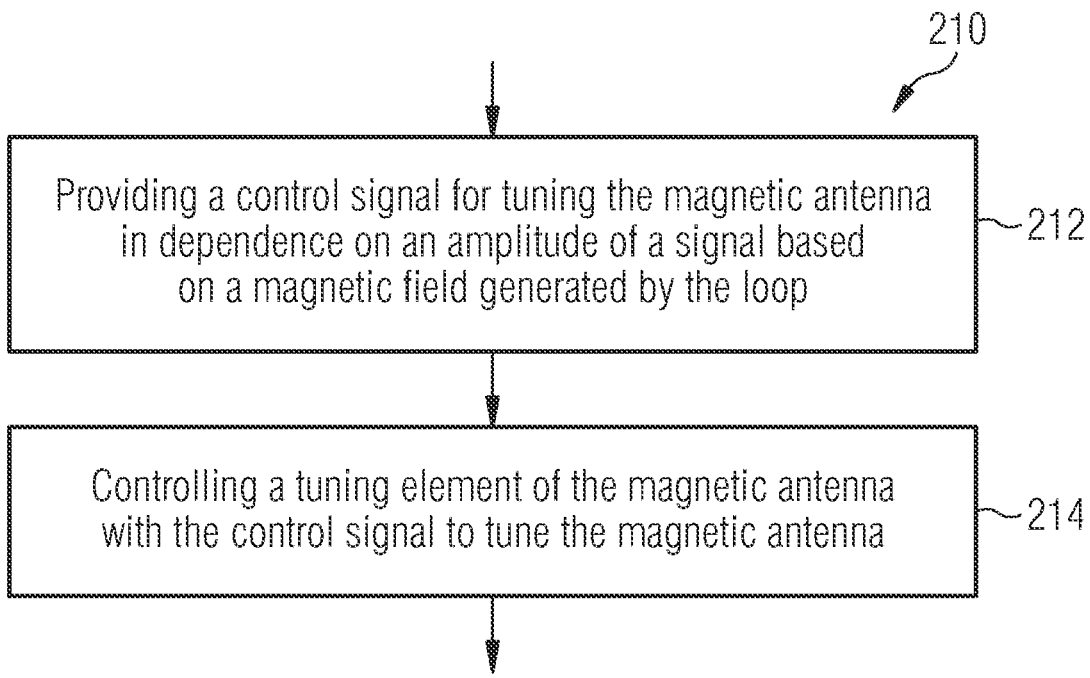
FIG. 26 is a flow diagram of a method for tuning a magnetic antenna having a loop interrupted one or several times, according to an embodiment of the present invention.

FIG. 26 shows a flow diagram of a method 210 for tuning a magnetic antenna having a loop interrupted one or several times, according to an embodiment of the present invention. The method 210 includes a step 212 of providing a control signal for tuning the magnetic antenna in dependence on an amplitude of a signal based on a magnetic field generated by the loop. Further, the method 210 includes a step 212 of controlling a tuning element of the magnetic antenna with the control signal to tune the magnetic antenna.

Figure 27:
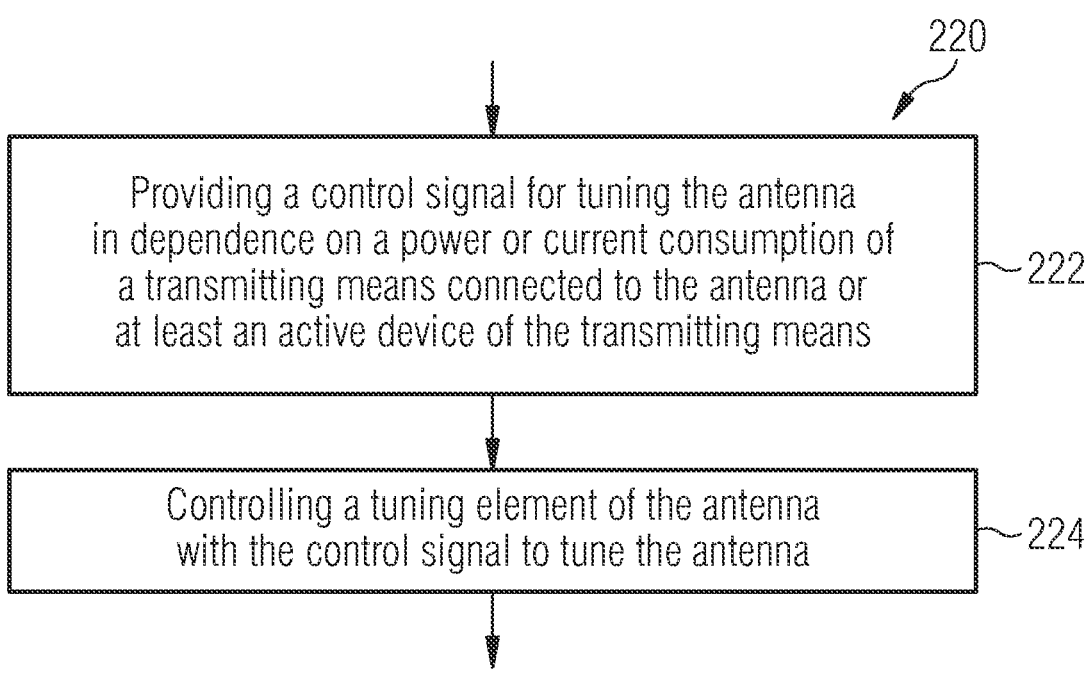
FIG. 27 is a flow diagram of a method for tuning a magnetic or electric antenna, according to an embodiment of the present invention

FIG. 27 shows a flow diagram of a method 220 for tuning an antenna, according to an embodiment of the present invention. The method 220 includes a step 222 of providing a control signal for tuning the antenna in dependence on a power or current consumption of a transmitting device connected to the antenna or at least an active device of the transmitting device. The method 220 further comprises a step 222 of controlling a tuning element of the antenna with the control signal to tune the antenna.

Embodiments of the present invention provide (e.g., self-tuning) magnetic antennas, e.g., for sensor nodes. With the IoT, the Internet of Things, the number of wirelessly communicating sensor nodes increases. This also places increasing demands on a small form factor and ease of use. These requirements can be poorly met with existing electric antennas. Embodiments of the present invention allow the usage of magnetic antennas in sensor nodes and thus meet the aforementioned requirements.

The embodiments of the antenna arrangement or the generation of the tuning signal for tuning a magnetic antenna described herein can be applied in a communication system, such as specified in ETSI standard TS 103 357 [7]. Obviously, the embodiments described herein can also be used in other communication systems, such as WLAN, Bluetooth, ZigBee, etc.

Further embodiments of the present invention will be described below, which can be used in combination with the embodiments described above or on their own.

Embodiments provide a participant of a wireless communication system, the participant comprising transmitting and/or receiving means [e.g., a transmitter, receiver, or transceiver] and an antenna arrangement connected to the transmitting and/or receiving means, the antenna arrangement comprising a magnetic antenna having a loop [e.g., current loop] interrupted [e.g., divided] one time or several times [e.g., at least twice].

In embodiments, the loop can be interrupted [e.g., divided] by one or several capacitance elements [e.g., capacitors, capacitance diodes].

For example, the loop of the magnetic antenna can be interrupted by at least two capacitance elements [e.g., at least twice].

In embodiments, the loop interrupted several times can be interrupted [e.g., divided] into at least two segments by the capacitance elements.

For example, the loop can be divided into n segments by n capacitance elements, wherein n is a natural number greater than or equal to two.

In embodiments, the at least two segments of the loop interrupted several times can be connected by the capacitance elements.

For example, the at least two segments of the loop interrupted several times and the at least two capacitance elements can be connected in series. In other words, two segments each of the loop interrupted several times can be connected by a respective capacitance element connected in series between the two segments.

In embodiments, the loop interrupted one or several times [e.g., the at least two segments of the loop] and the capacitance elements can form a resonant circuit.

In embodiments, the loop can form a coil.

In embodiments, the transmitting and/or receiving means can be connected to the magnetic antenna via one of the capacitance elements [e.g., wherein the one capacitance element and the loop interrupted one or several times [e.g., with the other capacitance elements] form a parallel resonant circuit].

In embodiments, the loop can be annular or of a shape having m corners, wherein m is a natural number greater than or equal to four.

For example, the loop can be quadrangular, pentagonal, hexagonal, heptagonal, octagonal, nonagonal, decagonal, hendecagonal, dodecagonal, and so forth.

In embodiments, the magnetic antenna can be implemented [e.g., realized] on a printed circuit board.

In embodiments, the antenna arrangement can include a tuning circuit for tuning the magnetic antenna.

In embodiments, the tuning circuit and the magnetic antenna can be implemented on the same printed circuit board.

In embodiments, the magnetic antenna can be a first magnetic antenna, wherein the antenna arrangement can further comprise a second magnetic antenna, wherein the loop interrupted one or several times of the first magnetic antenna and a loop of the second magnetic antenna are arranged substantially orthogonal to each other.

For example, a first area spanned by the loop interrupted one or several times of the first magnetic antenna and a second area spanned by the loop of the second magnetic antenna can be orthogonal to each other.

For example, a main radiation direction/main reception direction of the first magnetic antenna and a main radiation direction/main reception direction of the second magnetic antenna can be orthogonal to each other.

For example, a zero point of the first magnetic antenna and a zero point of the second magnetic antenna can be different.

In embodiments, a spanned area of the loop of the second magnetic antenna can be smaller than a spanned area of the loop of the first magnetic antenna by at least a factor of two [e.g., a factor of three, four, five, or ten].

For example, the loop of the second magnetic antenna can be "flattened".

In embodiments, the loop of the second magnetic antenna can be configured in a non-round manner to conform to a shape of the housing of the participant.

For example, the loop of the second magnetic antenna can be substantially rectangular.

In embodiments, the first magnetic antenna and the second magnetic antenna can be arranged adjacent to each other.

In embodiments, a conductor of the loop of the second magnetic antenna can be at least by a factor of two [e.g., a factor of three, four, or five] thicker or wider than a conductor of the loop of the first magnetic antenna.

In embodiments, the loop of the second magnetic antenna can be interrupted several times.

For example, the loop of the second magnetic antenna can be interrupted [at least twice] by at least two capacitance elements.

In embodiments, the participant can be configured to deactivate one of the magnetic antennas of the antenna arrangement [e.g., the first magnetic antenna or the second magnetic antenna] to change a radiation pattern [e.g., radiation direction or reception direction; e.g., main lobe] of the antenna arrangement.

For example, the participant can be configured to change a radiation pattern [e.g., radiation direction of radiation or reception direction; e.g., main lobe] of the antenna arrangement by deactivating one of the magnetic antennas of the antenna arrangement [e.g., the first magnetic antenna or the second magnetic antenna].

In embodiments, one of the magnetic antennas of the antenna arrangement can be deactivated by detuning the respective magnetic antenna [e.g., the first magnetic antenna or the second magnetic antenna].

In embodiments, one of the magnetic antennas of the antenna arrangement can be deactivated by connecting a coil in parallel to one of the capacitance elements of the loop of the respective magnetic antenna [e.g., the first magnetic antenna or the second magnetic antenna].

In embodiments, the participant can be configured to vary a radiation ratio of the antenna arrangement by detuning the self-resonance of at least one of the two magnetic antennas [e.g., the first magnetic antenna or the second magnetic antenna].

In embodiments, the first magnetic antenna and the second magnetic antenna can be controlled out of phase [e.g., 90°].

In embodiments, the participant can be configured to distribute a data packet [e.g., of the bit transmission layer] to be transmitted into a plurality of sub-data packets and to transmit the plurality of sub-data packets non-contiguously [e.g., using a time and/or frequency hopping method], wherein the participant can be configured to change the radiation pattern of the antenna arrangement at least once between the transmission of two sub-data packets.

For example, the participant can be configured to change the radiation pattern of the antenna arrangement after each transmitted sub-data packet or after a predetermined number of sub-data packets [e.g., by deactivating the respective other magnetic antenna of the antenna arrangement].

In embodiments, the participant can be configured to divide a data packet [e.g., of the bit transmission layer] to be transmitted into a plurality of sub-data packets and to transmit the plurality of sub-data packets non-contiguously using a frequency hopping method [e.g. and time hopping method], wherein the resonance frequencies of the first magnetic antenna and the second magnetic antenna can be intentionally slightly detuned so that when the plurality of sub-data packets are transmitted, a radiation pattern [e.g. radiation direction; e.g. main lobe] of the antenna arrangement varies due to the frequencies defined by the frequency hopping pattern.

For example, the resonance frequency of the first magnetic antenna and/or the second magnetic antenna can be detuned in a magnitude range that corresponds to the reciprocal quality. For a Q factor of Q=100, detuning can be performed in a window of no more than +/−1%, because even more detuning will result in hardly any more power being output.

In embodiments, the antenna arrangement can comprise tuning means for tuning the magnetic antenna, wherein the antenna arrangement is configured to tune the antenna automatically.

In embodiments, the antenna arrangement can further comprise an electric antenna.

In embodiments, the transmitting and/or receiving means can be a transmitting means [e.g., transmitter], a receiving means [e.g., receiver], or a transmitting-receiving means [transceiver].

In embodiments, the participant can be configured to communicate in the ISM band.

In embodiments, the participant can be an end point of the communication system.

In embodiments, the end point can be a sensor node or actuator node.

In embodiments, the end point can be battery-operated.

In embodiments, the end point can comprise an energy-harvesting element for generating electric energy.

In embodiments, the participant can be a base station of the communication system.

Further embodiments provide a communication system having at least two of the participants described herein.

For example, the at least two participants can be one or several end points [e.g., a plurality of end points] and one or several base stations. Obviously, the at least two participants can also be at least two end points or base stations.

Further embodiments provide a method for operating a participant of a communication system, the participant comprising an antenna arrangement, the antenna arrangement comprising a magnetic antenna having a loop interrupted one or several times. The method comprises a step of transmitting and/or receiving communication signals using the magnetic antenna.

Embodiments of the present invention provide a participant (e.g., an end point) of a communication system having a magnetic antenna.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus. Some or all of the method steps can be performed by a hardware apparatus (or using a hardware apparatus), such as a microprocessor, a programmable computer or an electronic circuit. In some embodiments, some or several of the most important method steps can be performed by such an apparatus.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium can be computer readable.

Some embodiments according to the invention include a data carrier comprising electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer.

The program code can, for example, be stored on a machine readable carrier.

Other embodiments comprise the computer program for performing one of the methods described herein, wherein the computer program is stored on a machine readable carrier.

In other words, an embodiment of the inventive method is, therefore, a computer program comprising a program code for performing one of the methods described herein, when the computer program runs on a computer.

A further embodiment of the inventive method is, therefore, a data carrier (or a digital storage medium or a computer-readable medium) comprising, recorded thereon, the computer program for performing one of the methods described herein. The data carrier, the digital storage medium, or the computer-readable medium are typically tangible or non-volatile.

A further embodiment of the inventive method is, therefore, a data stream or a sequence of signals representing the computer program for performing one of the methods described herein. The data stream or the sequence of signals can, for example, be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment in accordance with the invention includes an apparatus or a system configured to transmit a computer program for performing at least one of the methods described herein to a receiver. The transmission can be electronic or optical, for example. The receiver can be a computer, a mobile device, a memory device or a similar device, for example. The apparatus or the system can include a file server for transmitting the computer program to the receiver, for example.

In some embodiments, a programmable logic device (for example a field programmable gate array, FPGA) can be used to perform some or all of the functionalities of the methods described herein. In some embodiments, a field programmable gate array can cooperate with a microprocessor in order to perform one of the methods described herein. Generally, the methods are performed by any hardware apparatus. This can be a universally applicable hardware, such as a computer processor (CPU) or hardware specific for the method, such as ASIC.

The apparatuses described herein can be implemented, for example, by using a hardware apparatus or by using a computer or by using a combination of a hardware apparatus and a computer.

The apparatuses described herein or any components of the apparatuses described herein can be implemented at least partly in hardware and/or software (computer program).

The methods described herein can be implemented, for example, by using a hardware apparatus or by using a computer or by using a combination of a hardware apparatus and a computer.

The methods described herein or any components of the methods described herein can be performed at least partly by hardware and/or by software (computer program).

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] https://de.wikipedia.org/wiki/Schwingkreis
[2] J. Bollenbeck, R. Oppelt: "Ein neuartiges Tracking-Filter für hochwertige LO-Signale", UKW-Berichte March 2013, p. 157-176
[3] U.S. Pat. No. 7,890,070
[4] https://de.wikipedia.org/wiki/Gilbertzelle
[5] J. v. Parpart: "Breitbandige Ferrit-Hochfrequenztransformatoren", Hüthig GmbH, Heidelberg, 1997
[6] DE 10 2011 082 098 B4
[7] ETSI TS 103 357
[8] Klaus W. Kark: "Antennen and Strahlungsfelder", 5th edition, Springer Verlag, p. 233

The invention claimed is:

1. Antenna arrangement, comprising:
a magnetic antenna comprising a loop interrupted one or several times and at least one tuning element for tuning the magnetic antenna, and
a tuner connected to the tuning element,
wherein the tuner is configured to provide a control signal for tuning the magnetic antenna in dependence on a phase position of a signal advancing into the magnetic antenna, and to control the tuning element with the control signal to tune the magnetic antenna,
wherein the tuner is configured to provide the control signal for tuning the magnetic antenna in dependence on a phase relationship between the signal advancing into the magnetic antenna and a phase signal,
wherein the tuner is configured to derive a signal from the signal advancing into the magnetic antenna to obtain a derived signal,
wherein the tuner is configured to provide the control signal for tuning the magnetic antenna in dependence on a phase relationship between the derived signal and the phase signal,
wherein the tuner comprises a signal combiner configured to combine
the phase signal or a phase-shifted version of the phase signal, and
the derived signal or a phase-shifted version of the derived signal, to obtain a combined signal,
wherein the tuner is configured to control the tuning element with the control signal to regulate a DC component of the combined signal or a low-pass filtered version of the combined signal to a predetermined set value.

2. Antenna arrangement according to claim 1,
wherein the phase signal is based on a current flowing in at least a portion of the loop, or wherein the phase signal is based on a magnetic field generated by the loop.

3. Antenna arrangement according to claim 1,
wherein the phase signal is a power coupled out of the magnetic antenna.

4. Antenna arrangement according to claim 1,
wherein the tuner is configured to control the tuning element with the control signal to regulate a phase difference between the signal advancing into the magnetic antenna and the phase signal to a predetermined set value.

5. Antenna arrangement, comprising:
a magnetic antenna comprising a loop interrupted one or several times and at least one tuning element for tuning the magnetic antenna, and
a tuner connected to the tuning element,
wherein the tuner is configured to provide a control signal for tuning the magnetic antenna in dependence on an amplitude of a signal based on a magnetic field generated by the loop, and to control the tuning element with the control signal to tune the magnetic antenna,
wherein the tuner is configured to select a control signal parameter from a set of stored control signal parameters associated with corresponding amplitude values in dependence on the amplitude of the signal based on the magnetic field generated by the loop, and to provide the control signal in dependence on the control signal parameter, or wherein the tuner is configured, when a transmitting signal is transmitted at at least two different frequencies, to determine a tuning direction in which the control signal is to be readjusted based on at least two amplitudes of the signal resulting from the at least two different frequencies of the transmitting signal based on the magnetic field generated by the loop, and to readjust the control signal in dependence on the determined tuning direction, wherein the tuner comprises an induction loop or induction coil configured to provide the signal based on the magnetic field generated by the loop.

6. Antenna arrangement according to claim 5, wherein the tuner is configured to control the tuning element with the control signal to regulate the amplitude of the signal based on the magnetic field generated by the loop to a predetermined set value.

7. Antenna arrangement according to claim 5, wherein the tuner is configured to determine, in the case of a broadband transmission of a transmitting signal or a transmission of the transmitting signal at a plurality of frequencies, a frequency-dependent amplitude distribution of the signal based on the magnetic field generated by the loop, and to provide the control signal in dependence on the frequency-dependent amplitude distribution.

8. Antenna arrangement according to claim 1, wherein the loop is interrupted once, wherein the loop is interrupted by the tuning element.

9. Antenna arrangement according to claim 1, wherein the loop is interrupted several times, wherein the loop is interrupted by the tuning element and by one or several capacitance elements.

10. Antenna arrangement according to claim 1, wherein a loop circumference of the loop interrupted one or several times is ½ to ¹/₁₀ of a wavelength of the signal advancing into the magnetic antenna or of a transmitting signal to be transmitted or a receiving signal to be received with the magnetic antenna.

11. Antenna arrangement according to claim 1, wherein a frequency of the signal advancing into the magnetic antenna or of a transmitting signal to be transmitted or of a receiving signal to be received with the magnetic antenna is equal to or higher than 149 MHz, 400 MHz or 800 MHz or is in a range of 149 MHz to 930 MHz.

12. Antenna arrangement according to claim 1, wherein a frequency of the signal advancing into the magnetic antenna or of a transmitting signal to be transmitted or of a receiving signal to be received with the magnetic antenna is within an ISM band.

13. Antenna arrangement according to claim 1, wherein the magnetic antenna comprises a Q of 20 to 500.

14. Participant of a wireless communication system, wherein the participant comprises a transmitter and/or receiver and an antenna arrangement connected to the transmitter and/or receiver according to claim 1.

15. Method for tuning a magnetic antenna with a loop interrupted one or several times, comprising:
providing a control signal for tuning the magnetic antenna in dependence on a phase position of a signal advancing into the magnetic antenna, and
controlling a tuning element of the magnetic antenna with the control signal to tune the magnetic antenna,
wherein the control signal for tuning the magnetic antenna is provided in dependence on a phase relationship between the signal advancing into the magnetic antenna and a phase signal,
deriving a signal from the signal advancing into the magnetic antenna to obtain a derived signal,
wherein the control signal for tuning the magnetic antenna is provided in dependence on a phase relationship between the derived signal and the phase signal,
wherein
the phase signal or a phase-shifted version of the phase signal, and
the derived signal or a phase-shifted version of the derived signal, are combined to obtain a combined signal,
controlling the tuning element with the control signal to control a DC component of the combined signal or a low-pass filtered version of the combined signal to a predetermined set value.

16. Method for tuning a magnetic antenna comprising a loop interrupted one or several times, comprising:
providing a control signal for tuning the magnetic antenna in dependence on an amplitude of a signal based on a magnetic field generated by the loop; and
controlling a tuning element of the magnetic antenna with the control signal to tune the magnetic antenna,
selecting, in dependence on the amplitude of the signal based on the magnetic field generated by the loop, a control signal parameter from a set of stored control signal parameters associated with corresponding amplitude values, the control signal being provided in dependence on the control signal parameter,
or determining, when a transmitting signal is transmitted at at least two different frequencies, a tuning direction in which the control signal is to be readjusted based on at least two amplitudes of the signal resulting from the at least two different frequencies of the transmitting signal based on the magnetic field generated by the loop, and readjusting the control signal in dependence on the determined tuning direction,
wherein the signal based that is based on the magnetic field generated by the loop is provided by an induction loop or induction coil.

* * * * *